US011658676B2

(12) United States Patent  
Ota

(10) Patent No.: US 11,658,676 B2  
(45) Date of Patent: May 23, 2023

(54) DA CONVERSION CIRCUIT, ELECTRO-OPTICAL DEVICE AND ELECTRONIC APPARATUS

(71) Applicant: SEIKO EPSON CORPORATION, Tokyo (JP)

(72) Inventor: Hitoshi Ota, Shiojiri (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 17/981,177

(22) Filed: Nov. 4, 2022

(65) Prior Publication Data

US 2023/0055172 A1 Feb. 23, 2023

Related U.S. Application Data

(63) Continuation of application No. 17/847,884, filed on Jun. 23, 2022.

(30) Foreign Application Priority Data

Jun. 24, 2021 (JP) ................................. 2021-104754

(51) Int. Cl.
| | | |
|---|---|---|
| G09G 3/3275 | (2016.01) | |
| H03M 1/68 | (2006.01) | |
| G09G 3/3233 | (2016.01) | |
| G09G 3/20 | (2006.01) | |
| G09G 3/3266 | (2016.01) | |

(52) U.S. Cl.
CPC .......... *H03M 1/68* (2013.01); *G09G 3/2007* (2013.01); *G09G 3/3233* (2013.01);
(Continued)

(58) Field of Classification Search
CPC .. G09G 3/2007; G09G 3/2096; G09G 3/3233; G09G 3/3266; G09G 3/3275;
(Continued)

(56) References Cited

U.S. PATENT DOCUMENTS 4,611,195 A * 9/1986 Shosaku ............. H03M 1/1042  
341/145  
9,559,716 B1 1/2017 Matsui et al.  
(Continued)

FOREIGN PATENT DOCUMENTS

JP S60-132422 A 7/1985  
JP 2000-341125 A 12/2000  
(Continued)

OTHER PUBLICATIONS

Jan. 11, 2023 Office Action issued in U.S. Appl. No. 17/847,884.

*Primary Examiner* — Michael J Eurice  
(74) *Attorney, Agent, or Firm* — Oliff PLC

(57) ABSTRACT

A DA conversion circuit includes a first DA conversion circuit unit corresponding to a higher bit, a second DA conversion circuit unit corresponding to a lower bit, a capacitance element provided between the first DA conversion circuit unit and the second DA conversion circuit unit, the first DA conversion circuit unit includes a capacitance element and a selection circuit, the second DA conversion circuit unit includes a capacitance element and a selection circuit, and the selection circuit supplies a potential VL or VPH to one end of the capacitance element, and the selection circuit supplies the potential VL or VPL to one end of the capacitance element. The potential VPL is different from the potential VPH, and for example, VPL>VPH.

8 Claims, 20 Drawing Sheets

(52) U.S. Cl.
CPC ......... *G09G 3/3275* (2013.01); *G09G 3/3266* (2013.01); *G09G 2300/0819* (2013.01); *G09G 2300/0842* (2013.01); *G09G 2310/0202* (2013.01); *G09G 2310/027* (2013.01); *G09G 2310/08* (2013.01); *G09G 2320/0233* (2013.01)

(58) Field of Classification Search
CPC ... G09G 2300/0426; G09G 2300/0819; G09G 2300/0828; G09G 2300/0842; G09G 2310/0202; G09G 2310/027; G09G 2310/08; G09G 2320/0233; H03M 1/68; H03M 1/468
See application file for complete search history.

(56) References Cited

U.S. PATENT DOCUMENTS

| | | | | |
|---|---|---|---|---|
| 2002/0163457 | A1* | 11/2002 | Azami | H03M 1/0607 341/150 |
| 2010/0001892 | A1 | 1/2010 | Aruga et al. | |
| 2012/0112938 | A1* | 5/2012 | Haneda | H03M 1/1019 341/110 |
| 2013/0147649 | A1* | 6/2013 | Cheong | H03M 1/12 341/172 |
| 2014/0077979 | A1* | 3/2014 | Miki | H03M 1/1061 341/110 |
| 2016/0037110 | A1* | 2/2016 | Choi | H03M 1/002 348/294 |
| 2020/0244171 | A1* | 7/2020 | Chaput | H01L 41/042 |
| 2020/0403632 | A1* | 12/2020 | Chen | H03M 1/1033 |
| 2021/0043148 | A1* | 2/2021 | Lee | G09G 3/3291 |

FOREIGN PATENT DOCUMENTS

| | | |
|---|---|---|
| JP | 2002-190738 A | 7/2002 |
| JP | 2002-314419 A | 10/2002 |
| JP | 2009-232281 A | 10/2009 |
| JP | 2017-046252 A | 3/2017 |
| WO | 2012/153372 A1 | 11/2012 |

* cited by examiner

DA CONVERSION CIRCUIT, ELECTRO-OPTICAL DEVICE AND ELECTRONIC APPARATUS

The present application is a Continuation of U.S. application Ser. No. 17/847,884 filed Jun. 23, 2022 which is based on, and claims priority from JP Application Serial Number 2021-104754, filed Jun. 24, 2021, the disclosure of which is hereby incorporated by reference herein in its entirety.

BACKGROUND

1. Technical Field

The present disclosure relates to a DA conversion circuit, an electro-optical device and an electronic apparatus.

2. Related Art

An electro-optical device using, for example, an OLED as a display element has been known. OLED is an abbreviation for Organic Light Emitting Diode. In this electro-optical device, a pixel circuit including a transistor for causing a current to flow through the display element is provided corresponding to each pixel of a display image. The transistor supplies a current corresponding to a luminance level to the display element. As a result, the display element emits light at luminance corresponding to the current.

In the electro-optical device described above, a voltage corresponding to luminance is applied to a gate node of a drive transistor via a data line. Specifically, digital data that specifies luminance is converted to an analog voltage by a DA conversion circuit, and applied to the gate node of the drive transistor via the data line.

As a technique applied to such a DA conversion circuit, for example, the following technique has been known. Specifically, a technique has been known that includes a capacitance element corresponding to a higher bit, a capacitance element corresponding to a lower bit, a switching element provided corresponding to a capacitance element, which selects a potential Gnd or Vref in accordance with a bit, and supplies the potential to one end of a capacitance element, and a coupling capacitance provided between another end of the capacitance element corresponding to the higher bit and another end of the capacitance element corresponding to the lower bit (for example, see JP 2002-1907384 A).

However, in the technique described in JP 2002-1907384 A, there is a problem that accuracy of a voltage converted to analog deteriorates with respect to input data including a plurality of bits to be converted, and in particular, linearity worsens, in some cases.

SUMMARY

A DA conversion circuit according to an aspect of the present disclosure includes a first DA conversion circuit unit corresponding to a higher bit among a plurality of bits, a second DA conversion circuit unit corresponding to a lower bit among the plurality of bits, a coupling capacitance provided between the first DA conversion circuit unit and the second DA conversion circuit unit, wherein the first DA conversion circuit unit includes a higher capacitance element unit and a higher switching element unit, the second DA conversion circuit unit includes a lower capacitance element unit and a lower switching element unit, the higher switching element unit supplies either a first potential or a second potential to one end of the higher capacitance element unit, the lower switching element unit supplies either the first potential or a third potential to one end of the lower capacitance element unit, and the third potential is different from the second potential.

DESCRIPTION OF EXEMPLARY EMBODIMENTS

A DA conversion circuit according to exemplary embodiments of the present disclosure will be described below with reference to the accompanying drawings.

Note that, in each figure, a size and a scale of each unit is different from the actual size and the actual scale of each unit as appropriate. Moreover, the exemplary embodiments described below are suitable specific examples, and various technically preferable limitations are applied, but the scope of the disclosure is not limited to these modes unless it is specifically described in the following description to limit the disclosure.

First Exemplary Embodiment

Figure 1:
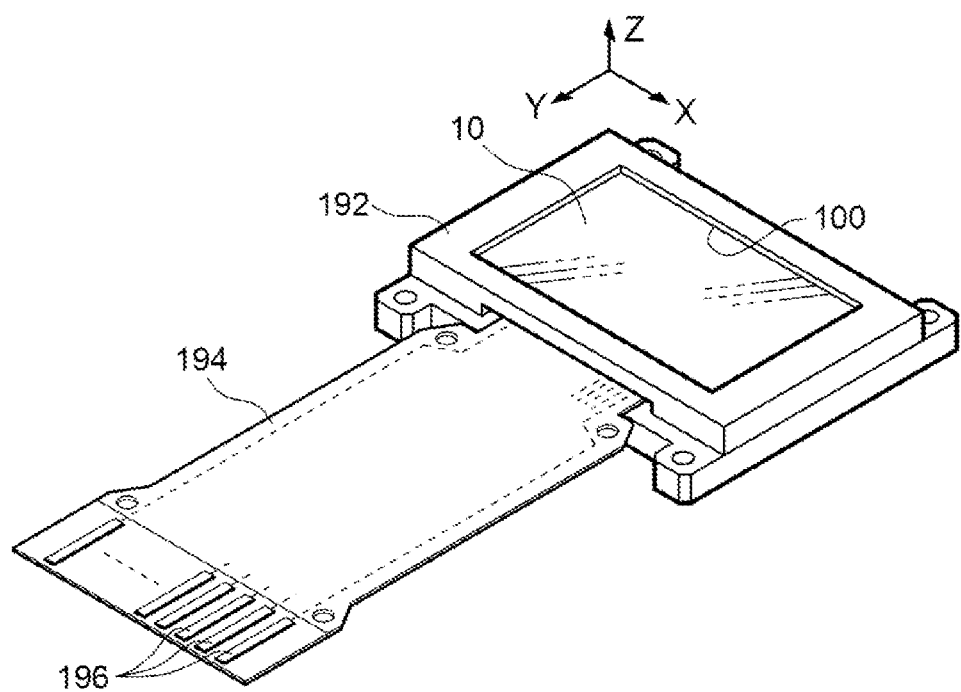
FIG. 1 is a perspective view of an electro-optical device to which a DA conversion circuit according to a first exemplary embodiment is applied.

FIG. 1 is a perspective view of an electro-optical device 10 to which a DA conversion circuit according to a first exemplary embodiment is applied. The electro-optical device 10 serves as a micro display panel configured to display an image in a head-mounted display, or the like, for example. The electro-optical device 10 includes a pixel circuit including a display element, a driving circuit configured to drive the pixel circuit, and the like. The pixel circuit and the driving circuit are integrated into a semiconductor substrate. The semiconductor substrate is typically a silicon substrate, but may be other semiconductor substrates.

The electro-optical device 10 is housed in a frame-shaped case 192 opening in a display region 100. The electro-optical device 10 is coupled to one end of an FPC substrate 194. FPC is an abbreviation for Flexible Printed Circuits. A plurality of terminals 196 coupled to a host device (not illustrated) are provided at another end of the FPC substrate 194. When the plurality of terminals 196 are coupled to the host device, the electro-optical device 10 is supplied with video data, synchronization signals, and the like via the FPC substrate 194 from the host device.

Note that, in the figure, an X direction indicates an extension direction of a scanning line in the electro-optical device 10, and a Y direction indicates the extension direction of a data line. A two-dimensional plane defined by the X direction and the Y direction is a substrate surface of the semiconductor substrate. A Z direction is perpendicular to the X direction and the Y direction, and is an emission direction of light emitted from the display element.

Figure 2:
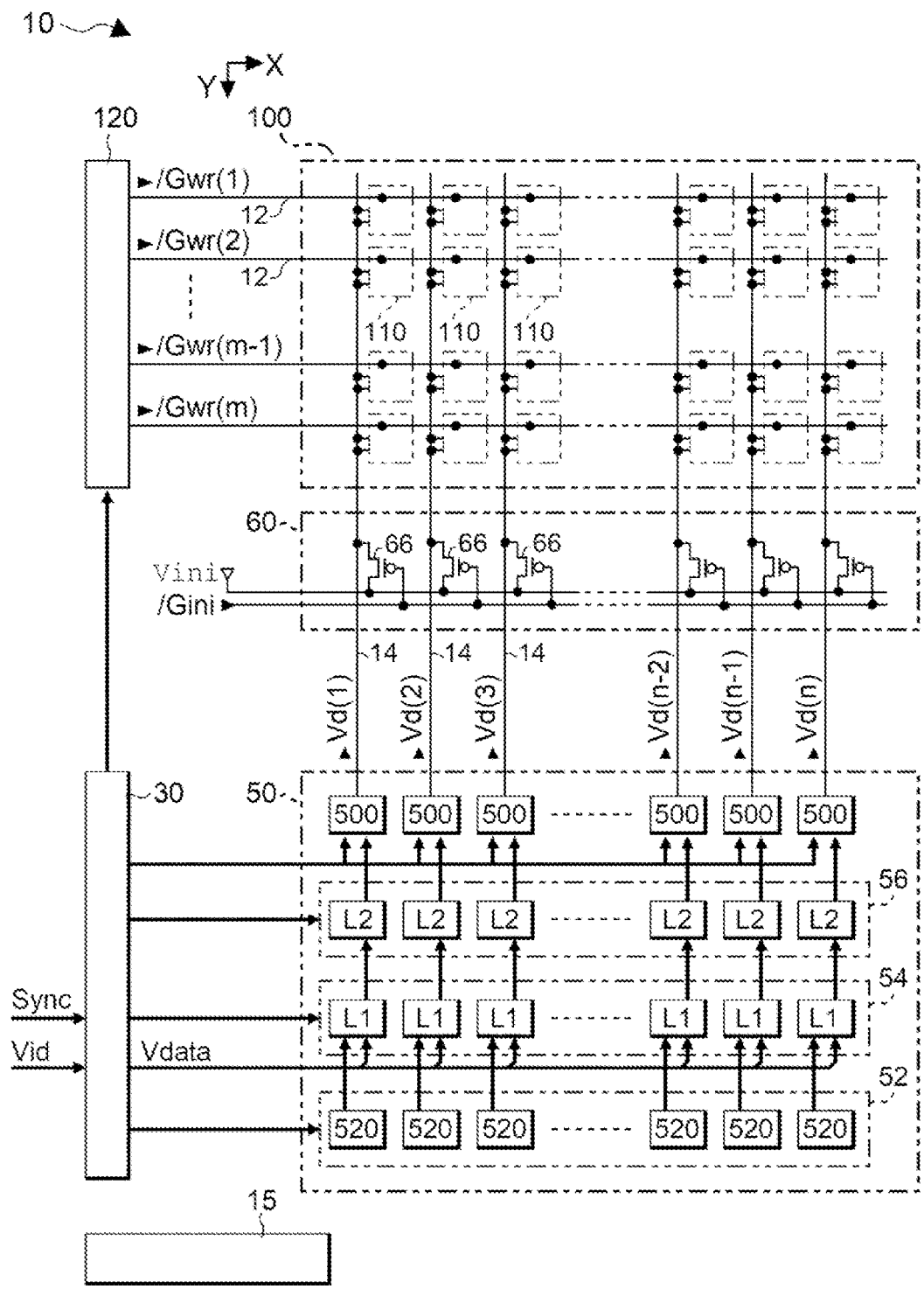
FIG. 2 is a block diagram illustrating an electrical configuration of an electro-optical device.

FIG. 2 is a block diagram illustrating an electrical configuration of the electro-optical device 10. As illustrated in the figure, the electro-optical device 10 is broadly classified into a power supply circuit 15, a control circuit 30, a data signal output circuit 50, an initialization circuit 60, a display region 100, and a scanning line driving circuit 120.

In the display region 100, m rows of scanning lines 12 are provided along the X direction in the figure, and n columns of data lines 14 are provided along the Y direction, so as to be mutually and electrically insulated from each scanning line 12. Note that, m and n are integers equal to or greater than 2.

In the display region 100, pixel circuits 110 are provided corresponding to intersections between the m rows of scanning lines 12 and the n columns of data lines 14. Thus, the pixel circuits 110 are arrayed in a matrix of vertical m rows by horizontal n columns. In the array of the matrix, in order to distinguish the rows from each other, the rows may be referred to as a 1st, 2nd, 3rd, . . . , (m−1)-th, and m-th row sequentially from a top in the figure. Similarly, in order to distinguish the columns in the matrix from each other, the columns may be referred to as a 1st, 2nd, 3rd, . . . , (n−1)-th, and n-th column sequentially from a left in the figure.

Note that, an integer i from 1 to m is used for generally describing the scanning lines 12. Similarly, an integer j from 1 to n is used for generally describing the data lines 14.

The control circuit 30 controls each unit based on video data Vid and a synchronization signal Sync supplied from the host device. The video data Vid specifies a gray scale level of a pixel in an image to be displayed, for example, with eight bits for each of three primary colors.

The synchronization signal Sync includes a vertical synchronization signal instructing a vertical scanning start of the video data Vid, a horizontal synchronization signal instructing a horizontal scanning start, and a dot clock signal indicating timing for one pixel portion of the video data.

A pixel of an image to be displayed in the present exemplary embodiment and the pixel circuit 110 in the display region 100 correspond to each other in a one-to-one manner.

Luminance characteristics at a gray scale level indicated by the video data Vid supplied from the host device, and luminance characteristics in an OLED included in the pixel circuit 110 do not necessarily match.

Thus, in order to cause the OLED to emit light at luminance corresponding to the gray scale level indicated by the video data Vid, the control circuit 30 up-converts eight bits of the video data Vid to, for example ten bits in the present exemplary embodiment, and outputs the ten bits, as video data Vdata. Thus, the 10-bit video data Vdata is data corresponding to the gray scale level specified by the video data Vid.

Note that, for the up-conversion, a look-up table is used in which the correspondence between the eight bits of the video data Vid as input and the ten bits of the video data Vdata as output is stored in advance. Further, the control circuit 30 generates various control signals to control each unit, but details will be described below.

The scanning line driving circuit 120 is a circuit for outputting various signals, and in accordance with control by the control circuit 30, driving the pixel circuits 110 arrayed in the m rows by n columns for each row. For example, the scanning line driving circuit 120 supplies scanning signals /Gwr(1), /Gwr(2), . . . , /Gwr(m−1), /Gwr(m) in order to the scanning lines 12 in the 1st, 2nd, 3rd, . . . , (m−1)-th, and m-th rows, respectively. Typically, a scanning signal supplied to the scanning line 12 in an i-th row is denoted as /Gwr(i). The scanning line driving circuit 120 outputs various control signals in addition to the scanning signals /Gwr(1) to /Gwr(m), but details will be described later.

The data signal output circuit 50 is a circuit for outputting a data signal of a voltage corresponding to luminance, toward the pixel circuit 110 located in a row selected by the scanning line driving circuit 120. Specifically, the data signal output circuit 50 includes a selection circuit group 52, a first latching circuit group 54, a second latching circuit group 56, n DA conversion circuits 500. The selection circuit group 52 includes a selection circuit 520 corresponding to each of the n columns, the first latching circuit group 54 includes a first latching circuit L1 corresponding to each of the n columns, and the second latching circuit group 56 includes a second latching circuit L2 corresponding to each of the n columns.

That is, a set of the selection circuit 520, the first latching circuit L1, the second latching circuit L2, and the DA conversion circuit 500 is provided corresponding to each column. The selection circuit 520 in a j-th column instructs the first latching circuit L1 in the j-th column to select video data of the j-th row of the video data Vdata output from the control circuit 30, and the first latching circuit L1 in the j-th column latches the video data Vdata according to the instruction. The second latching circuit L2 in the j-th column outputs the video data Vdata latched by the first latching circuit L1 in the j-th column to the DA conversion circuit 500 in the j-th column in a writing period described later in accordance with control by the control circuit 30.

The DA conversion circuit 500 in the j-th column converts the 10-bit video data Vdata output from the second latching circuit L2 in the j-th column into a data signal of an analog voltage, and outputs the converted video data to the data line 14 in the j-th column as the data signal. Note that, details of the DA conversion circuit 500 will be described later.

The initialization circuit 60 is a collection of transistors 66 provided corresponding to the data lines 14 in a one-to-one manner. One end of the transistor 66 corresponding to the j-th column is coupled to a power supply line of a potential Vini, and another end of the transistor 66 is coupled to the data line 14 in the j-th column. In addition, a gate node of the transistor 62 in each column is supplied with a control signal/Gini in common by the control circuit 30.

In the figure, potentials of the data lines 14 in the 1st, 2nd, ..., (n−1)-th, and n-th columns are denoted as Vd(1), Vd(2), ..., Vd(n−1), Vd(n), respectively. Typically, a potential of the data line 14 in the j-th column is denoted as Vd(j).

The power supply circuit 15 generates various power supply potentials, power supply voltages, and the like used in the electro-optical device 10. Examples of the various power supply potentials and power supply voltages include power supply voltages in the scanning line driving circuit 120 and the data signal output circuit 50, potentials Vel, Vini, Vorst, Vrst, VL, VPL, VPH, and the like.

Note that, a reference of a voltage zero is a ground potential Gnd (not illustrated), but other than that, the potentials and the voltages are not strictly used in the present description. In addition, in the present description, the power supply voltage, and the and power supply potential refer to a voltage and a potential that are approximately constant, respectively.

Figure 3:
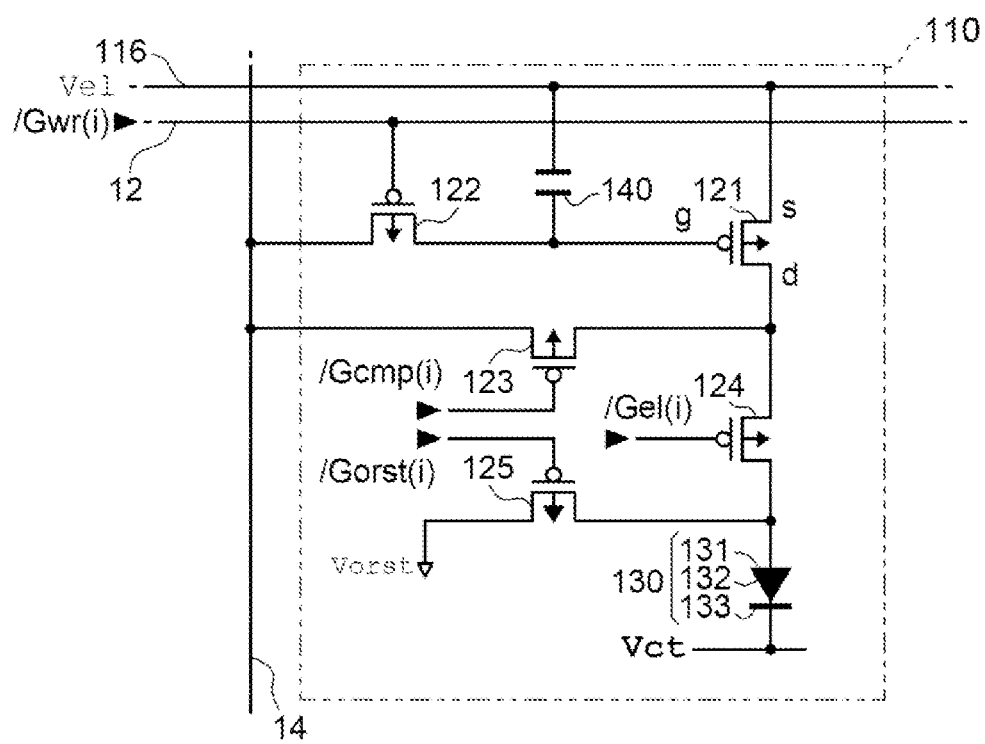
FIG. 3 is a circuit diagram illustrating a pixel circuit in the electro-optical device.

FIG. 3 is a circuit diagram illustrating the pixel circuit 110. The pixel circuits 110 arrayed in the m rows by n columns are electrically identical to each other. Thus, the pixel circuit 110 will be explained with the pixel circuit 110 located in the i-th row and the j-th column as a representative.

As illustrated, the pixel circuit 110 includes an OLED 130, p-channel type transistors 121 to 125, and a capacitance element 140. The transistors 121 to 125 are, for example, MOSs. Note that, MOS is an abbreviation of Metal-Oxide-Semiconductor field effect transistor.

Further, in addition to the scanning signal Gwr(m), the pixel circuit 110 in the i-th row is supplied with control signals /Gel(i), /Gcmp(i), and Gorst(i) from the scanning line driving circuit 120.

The control signal/Gel(i) generally denotes control signals/Gel (1), /Gel (2), ..., /Gel (m−1), and/Gel (m) that are supplied in order corresponding to the 1st, 2nd, ..., (m−1)-th, and m-th rows. Similarly, the control signal/Gcmp (i) generally denotes control signals/Gcmp (1), /Gcmp (2), ..., /Gcmp (m−1), and/Gcmp (m) that are supplied in order corresponding to the 1st, 2nd, ..., (m−1)-th, and m-th rows. The same is true for the control signal/Gorst(i), and /Gorst(i) generally denotes control signals/Gorst(1), /Gorst(2), .../Gorst(m−1), and/Gorst (m) that are supplied in order corresponding to the 1st, 2nd, ..., (m−1)-th, m-th rows.

The OLED 130 is a display element in which a light emission function layer 132 is sandwiched between a pixel electrode 131 and a common electrode 133. The pixel electrode 131 functions as an anode, and the common electrode 133 functions as a cathode. Note that, the common electrode 133 has light reflectivity and light transparency, and thus is an example of a semi-reflective semi-transparent reflective layer. In the OLED 130, when a current flows from the anode to the cathode, holes injected from the anode and electrons injected from the cathode are recombined in the light emission function layer 132 to generate excitons and generate white light.

In a case of a color display, the generated white light resonates in an optical resonator formed of, for example, a reflective layer and a semi-reflective semi-transparent layer (not illustrated), and is emitted at a resonance wavelength set corresponding to any color of R (red), G (green), and B (blue). A color filter corresponding to the color is provided on a light emission side from the optical resonator. Thus, the emitted light from the OLED 130 is visually recognized by an observer after coloration by the optical resonator and the color filter. Note that, the optical resonator is not illustrated. In addition, when the electro-optical device 10 simply displays a monochrome image only with darkness and lightness, the above color filter is omitted.

In the transistor 121 of the pixel circuit 110 in the i-th row and the j-th column, a gate node g is coupled to a drain node of a transistor 122, and a source node s is coupled to a power supplying line 116 of a power source wiring line to which the potential Vel is supplied, and a drain node d is coupled to a source node of a transistor 123 and a source node of a transistor 124. In the capacitance element 140, one end is coupled to the gate node g of the transistor 121, and another end is coupled to the power supplying line 116. Thus, the capacitance element 140 holds a voltage between the gate node g and the source node s in the transistor 121.

Note that, the other end of the capacitance element 140 may be coupled to other power supplying lines other than the power supplying line 116, as far as a potential is held substantially constant.

In the present exemplary embodiment, as the capacitance element 140, for example, a so-called MOS capacitance formed by sandwiching a gate insulating layer of a transistor between a semiconductor layer of the transistor and a gate electrode layer is used. Note that, as the capacitance element 140, a parasitic capacitance of the gate node g of the transistor 121 may be used, and a so-called metal capacitance formed by sandwiching an insulating layer by mutually different conductive layers in a semi-conductor substrate may be used.

In the transistor 122 of the pixel circuit 110 in the i-th row and the j-th column, a gate node is coupled to the scanning line 12 in the i-th row, and a source node is coupled to the data line 14 in the j-th column. In the transistor 123 of the pixel circuit 110 in the i-th row and the j-th column, the control signal/Gcmp(i) is supplied to a gate node, and a drain node is coupled to the data line 14 in the j-th column. In the transistor 124 of the pixel circuit 110 in the i-th row and the j-th column, the control signal/Gel(i) is supplied to a gate node, and a drain node is coupled to the pixel electrode 131 being an anode of the OLED 130 and to a drain node of the transistor 125.

In the transistor 125 of the pixel circuit 110 in the i-th row and the j-th column, the control signal/Gorst(i) is supplied to a gate node, and a source node is coupled to a power supplying line to which the potential Vorst is supplied.

Note that, the potential Vorst is, for example, the ground potential Gnd, or a potential at a low level close to the ground potential Gnd. Specifically, the potential Vorst is a potential at which a current does not flow to the OLED 130 when supplied to the pixel electrode 131 in the OLED 130. Also, the potential Vct is supplied to the common electrode 133 that functions as the cathode of the OLED 130.

Figure 4:
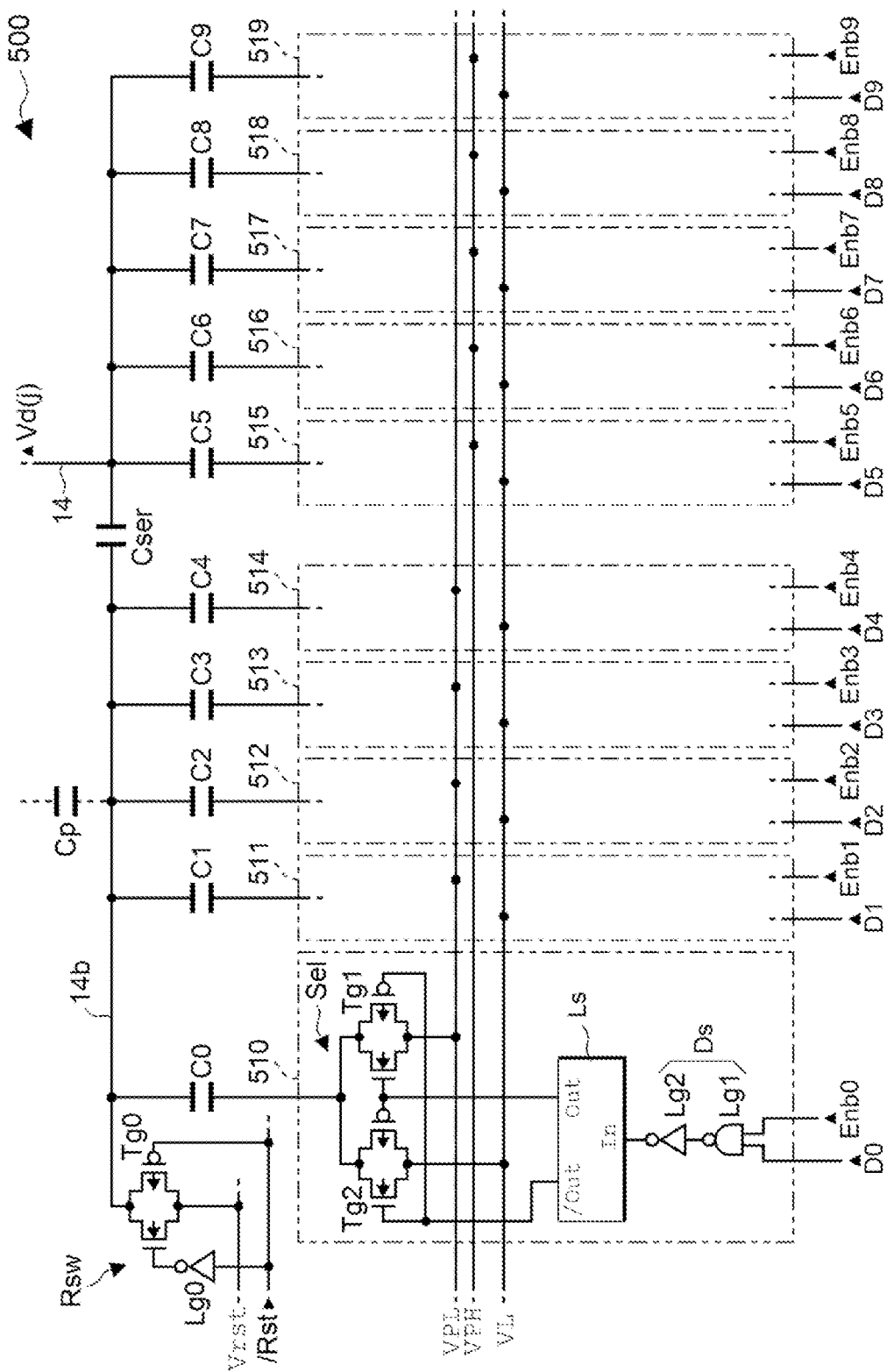
FIG. 4 is a circuit diagram illustrating the DA conversion circuit in a data signal output circuit.

FIG. 4 is a circuit diagram illustrating the DA conversion circuit 500 corresponding to the j-th column.

In the DA conversion circuit 500 in the j-th column, bits D0 to D9 are supplied from the second latching circuit L2 in the j-th column. Additionally, to the DA conversion circuit 500 in the j-th column, control signals Enb0 to Enb9, and a control signal/Rst are supplied from the control circuit 30, and the potentials Vrst, VL, VPL, and VPH are supplied from the power supply circuit 15.

The bits D0 to D9 are ten bits of the video data Vdata output from the second latching circuit L2 in the j-th column, and are data to be converted by the DA conversion circuit 500. Of the ten bits, a lowest bit is D0, and weight increases in order of D1, D2, . . . , from the bit D0, and a highest bit is D9.

The control signals Enb0 to Enb9 are signals that sequentially specify taking-in timing of bits D0 to D9, respectively. The control signal/Rst is a signal for resetting the capacitance element.

As illustrated in the figure, the DA conversion circuit 500 includes capacitance elements C0 to C9, Cser, a switch Rsw, and selection circuits 510 to 519. The capacitance elements C0 to C9 and the selection circuits 510 to 519 are paired as follows so as to correspond to the respective bits. Specifically, the selection circuit 510 and the capacitance element C0 form a pair corresponding to the bit D0, the selection circuit 511 and the capacitance element C1 form a pair corresponding to the bit D1, and hereinafter, in the same manner, the selection circuit 519 and the capacitance element C9 form a pair corresponding to the bit D9.

Note that, in the present exemplary embodiment, among the ten bits of video data Vdata, the bits D5 to D9 are an example of higher bits, and the bits D0 to D4 are an example of lower bits.

The selection circuits 510 to 514 corresponding to the lower bits select the potential VL or VPL, and supply the selected potential to one end of a corresponding capacitance element. Also, the selection circuits 515 to 519 corresponding to the higher bits select the potential VL or VPH, and supply the selected potential to one end of a corresponding capacitance element.

For example, the selection circuit 510 corresponding to the bit D0 takes in the bit D0 at timing specified by the control signal Enb0, selects the potential VL or VPL according to a logical level of the bit D0 taken in, and supplies the selected potential to one end of the capacitance element C0. Further, for example, the selection circuit 516 corresponding to the bit D6 takes in the bit D6 at timing specified by the control signal Enb6, selects the potential VL or VPH according to a logical level of the bit D6 taken in, and supplies the selected potential to one end of the capacitance element C6.

Capacitance values of the respective capacitance elements C0 to C9 have the following ratios in the present exemplary embodiment. Specifically, when the capacitance value of the capacitance element C0 is "1", then the capacitance values of the respective capacitance elements C2, C3, C4, C5, C6, C7, C8, and C9 are, in this order, "2", "4", "8", "16", "1", "2", "4", "8", and "16".

Weights of the respective bits D0 to D9 are, when considered as a total of ten bits, "1", "2", "4", "8", "16", "32", "64", "128", "256", and "512", in order. Therefore, the capacitance values of the respective capacitance elements C0 to C9 do not match the weight. However, when the bits D0 to D9 are divided into the lower bits D0 to D4, the higher bits D5 to D9, the bit D5 is defined as a lowest bit of the bits D5 to D9, and the weight is regarded as "1", the weights of the respective bits D5 to D9 are "1", "2", "4", "8", and "16" in order. In the present description, since it is also necessary to consider the case where the bits D0 to D9 are divided into the lower bits D0 to D4, and the higher bits D5 to D9, it is expressed that the capacitance elements C0 to C9 have the capacitance values corresponding to the weights of the bits D0 to D9, respectively.

Further, the capacitance element Cser is an example of a coupling capacitance, and a capacitance value of the capacitance element Cser in the first exemplary embodiment is "1". Note that, for the capacitance values of the respective capacitance elements C0 to C9, and CSer, errors to some extent are tolerated as long as linearity described below is maintained.

In the present exemplary embodiment, the MOS capacitance is used as the capacitance element 140 in the pixel circuit 110, and thus the MOS capacitance may also be used for the capacitance elements C0 to C9, and Cser, but a metal capacitance may be used.

Another ends of the respective capacitance elements C0 to C4, of the capacitance elements C0 to C9, corresponding to the lower five bits are electrically coupled to one end of the capacitance element Cser. For convenience, a coupling line between the other ends of the respective capacitance elements C0 to C4 and the one end of the capacitance element Cser is denoted as a relay line 14b. Additionally, another ends of the respective capacitance elements C5 to C9, of the capacitance elements C0 to C9, corresponding to the higher five bits are electrically coupled to the data line 14, which is an output end Out of the DA conversion circuit 500, and another end of the capacitance element Cser.

Note that, in the present description, "electrically coupled" means a direct or indirect coupling or joint among two or more elements, and includes, for example, coupling among two or more elements in a semiconductor substrate, not directly, but via a different wiring layer and a contact hole.

The switch Rsw is brought into an on state or an off state in accordance with the control signal/Rst between a power supplying line of the potential Vrst and the relay line 14b. Specifically, the switch Rsw is brought into the on state when the control signal/Rst is at an L level, and is brought into the off state when the control signal/Rst is at an H level.

In the present description, the "on state" of a switch or a transistor means that both end of the switch, or a source node and a drain node in the transistor are electrically closed to be in a low impedance state. In addition, the "off state" of a switch or a transistor means that both end of the switch, or a source node and a drain node are electrically opened to be in a high impedance state.

The switch Rsw may be configured with a NOT circuit Lg0 that outputs a negative signal of the control signal/Rst, and a transmission gate Tg0. The transmission gate Tg0 is an analog switch in which an n-type transistor in which a negative signal by the NOT circuit Lg0 is supplied to a gate node, and a p-type transistor in which the control signal/Rst is supplied to a gate node, are combined.

The selection circuit 510 paired with the capacitance element C0 includes an AND circuit Ds, a level shifter Ls, and a selector Sel. Of these, the AND circuit Ds outputs a logical product signal of the bit D0 of the video data Vdata output from the second latching circuit L2 in the j-th column, and the control signal Enb0 supplied from the control circuit 30. The AND circuit Ds is actually configured with a NAND circuit Lg1 that outputs a negative logical product signal of the bit D0 and the control signal Enb0, and a NOT circuit Lg2 that outputs a negative signal of the negative logical product signal.

The level shifter Ls converts logical amplitude of the logical product signal output by the AND circuit Ds to output a forward rotation signal in which a logical level of the logical product signal is maintained from the output end Out, and outputs a reverse rotation signal in which the logical level of the logical product signal is reversed from an output end/Out. Note that, a power supply potential of the level shifter Ls is not particularly illustrated, but is Vddh and Vssh. Thus, in the forward rotation signal or the reverse rotation signal output from the level shifter Ls, the H level is the potential Vddh, and the L level is the potential Vssh.

The selector Sel in the selection circuit 510 selects the potential VPL, when the forward rotation signal output from the level shifter Ls is at the H level, and the reverse rotation signal is at the L level. In other words, the selector Sel selects the potential VPL, when the bit D0 is "1" (H level), and the control signal Enb0 is at the H level.

In addition, the selector Sel selects the potential VL, when the forward rotation signal output from the level shifter Ls is at the L level, and the reverse rotation signal is at the H level. In other words, the selector Sel selects the potential VL, when the bit D0 is "0" (L level), or the control signal Enb0 is at the L level.

The selector Sel is actually configured with a transmission gate Tg1 provided between a power supplying line of the potential VPL, and the one end of the capacitance element C0, and a transmission gate Tg2 provided between a power supplying line of the potential VL and the one end of the capacitance element C0.

In this configuration, when the forward rotation signal output from the level shifter Ls is at the H level, and the reverse rotation signal is at the L level, the transmission gate Tg1 is brought into the on state, the transmission gate Tg2 is brought into the off state, the forward rotation signal output from the level shifter Ls is at the L level, and the reverse rotation signal is at the H level, the transmission gate Tg1 is brought into the off state, and the transmission gate Tg2 is brought into the on state.

Although the selection circuit 510 paired with the capacitance element C0 has been described here, the other selection circuits 511 to 514 corresponding to the lower bits each have a similar configuration to that of the selection circuit 510 except that the bits D1 to D4 of an input signal and the control signals Enb1 to Enb4 are different.

In addition, the selection circuits 515 to 519 corresponding to the higher bits each have a similar configuration to that of the selection circuits 510 to 514, except that the potential VPH is selected when the forward rotation signal output from the level shifter Ls is at the H level, and the reverse rotation signal is at the L level, and that the bits D5 to D9 of an input signal and the control signals Enb5 to Enb9 are different.

Figure 5:
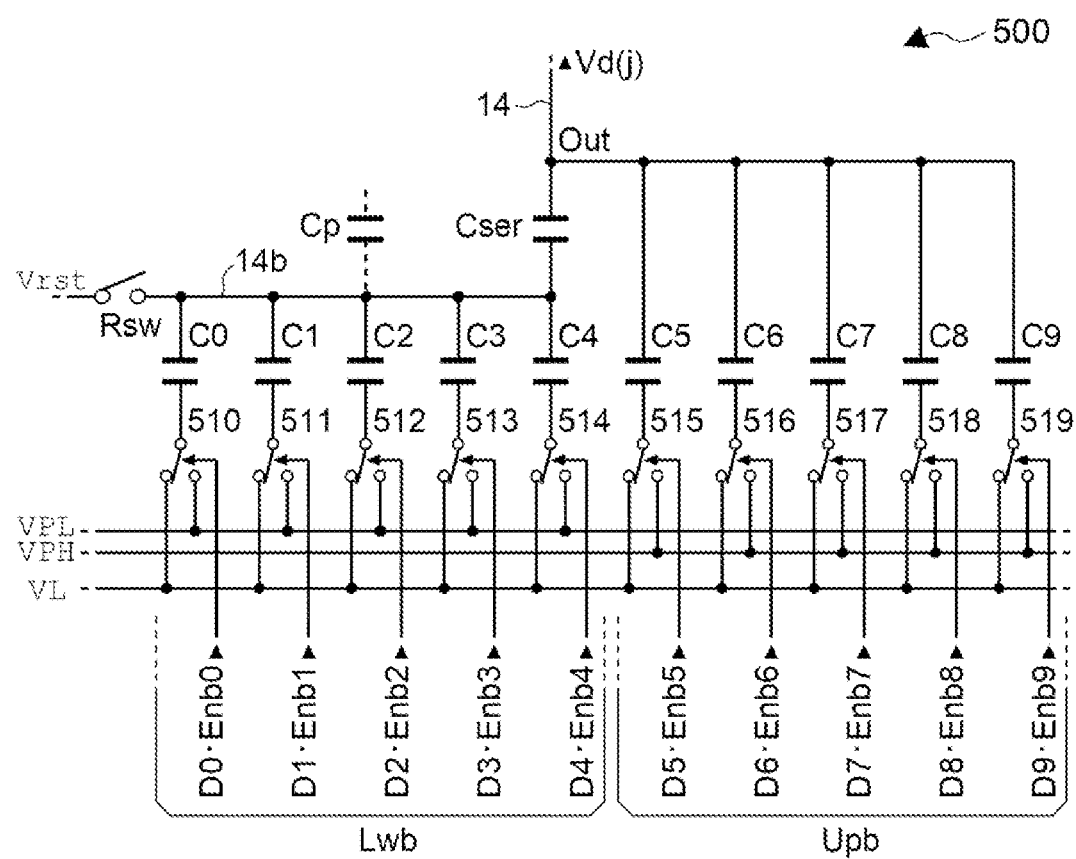
FIG. 5 is a diagram illustrating an equivalent circuit of the DA conversion circuit.

FIG. 5 is a diagram illustrating an equivalent circuit in the DA conversion circuit 500 in the j-th column.

The selection circuit 510 is denoted as a single pole double throw switch that selects the potential VL, when a logical product signal of the bit D0 and control signal Enb0 (D0·Enb0) is at the L level, and selects the potential VPL, when the logical product signal is at the H level. Each of the selection circuits 511 to 514 is also denoted as a single pole double throw switch similar to the selection circuit 510.

The selection circuit 515 is denoted as a single pole double throw switch that selects the potential VL, when a logical product signal of the bit D5 and control signal Enb5 (D5·Enb5) is at the L level, and selects the potential VPH, when the logical product signal is at the H level. Each of the selection circuits 516 to 519 is also denoted as a single pole double throw switch similar to the selection circuit 515.

In FIG. 4 and FIG. 5, the DA conversion circuit 500 in the j-th column has been described, but the DA conversion circuits 500 corresponding to the other columns each have a similar configuration. Note that, FIG. 4 and FIG. 5 each illustrate only an electrical configuration, and do not illustrate a position and an array of an element configuring the DA conversion circuit 500.

Operation of the DA conversion circuit 500 is divided into a reset period and an output period. Note that, the reset period of the DA conversion circuit 500 includes an initialization period (a) and a compensation period (b) of an operation period of the electro-optical device 10 described later, and the output period of the DA conversion circuit 500 is a writing period (c) of the operation period of the electro-optical device 10.

In the DA conversion circuit 500, in the reset period, the switch Rsw is brought into the on state, and the selection circuits 510 to 519 select the potential VL. In addition, at an end of the reset period, the data line 14, which is the output end Out, is at approximately the same potential as the potential Vrst, specifically a threshold equivalent voltage of the transistor 121 described below, due to an element not illustrated in FIG. 5. Thus, a charge corresponding to a capacitance value is accumulated in each of the capacitance elements C0 to C9.

In the output period in the DA conversion circuit 500, the selection circuits 510 to 514 each maintain selection of the potential VL when a corresponding logical product signal is at the L level, and each select the potential VPL when the corresponding logical product signal is at the H level. In addition, in the output period, the selection circuits 515 to 519 each maintain selection of the potential VL when a corresponding logical product signal is at the L level, and each select the potential VPH when the corresponding logical product signal is at the H level. As described below, at an end of the output period, the control signals Enb0 to Enb9 are at the H level, and thus the selection circuits 510 to 519 select the potential VL or VPL (or VPH) in accordance with the logical levels of bits D0 to D9, respectively.

That is, in the output period, the voltages at one ends of the capacitance elements C0 to C9 are either changed (increased) or maintained in accordance with the bits D0 to D9, respectively. Therefore, of the capacitance elements C0 to C9, at another ends of the capacitance elements C0 to C9 where the voltages at the one ends changes, respectively, discharge of accumulated charges increases a voltage at the end of the reset period, by a voltage in accordance with a capacitance value.

At the other end of each of the capacitance elements C5 to C9 corresponding to the higher bits, a voltage of the data line 14 is increased in accordance with a capacitance value. In contrast, the relay line 14b, which is at the other end of each of the capacitance elements C0 to C4 corresponding to the lower bits, is coupled to the data line 14 via the capacitance element Cser, and thus a voltage change of the relay line 14b is compressed by a ratio defined by the capacitance elements C0 to C4 and Cser, and changes a voltage of the data line 14. When the ratio is denoted as a compression ratio k, the compression ratio k is represented by Equation (1) below.

$$k=Cser/(Cser+C0+C1+C2+C3+C4) \qquad (1)$$

Note that, in the first exemplary embodiment, the compression ratio k is 1/32 (=1/(1+1+2+4+8+16)).

In FIG. 5, a circuit including the capacitance elements C5 to C9 and the selection circuits 515 to 519 is referred to as a first DA conversion circuit unit Upb. Of these, the capacitance elements C5 to C9 are examples of a higher capacitance element unit, and the selection circuits 515 to 519 are examples of a higher switching element unit. Such a first DA conversion circuit unit Upb outputs a voltage corresponding to the bits D5 to D9 to the data line 14.

Similarly, a circuit including the capacitance elements C0 to C4 and the selection circuits 510 to 514 is referred to as a second DA conversion circuit unit Lwb. Of these, the capacitance elements C0 to C4 are examples of a lower capacitance element unit, and the selection circuits 510 to 514 are examples of a lower switching element unit. Such a second DA conversion circuit unit Lwb outputs a voltage corresponding to the bits D0 to D4 to the relay line 14b. However, a voltage change of the relay line 14b is compressed to 1/32 of the compression ratio k, and is output to the data line 14.

Thus, even when the bits D0 to D4 are the same as the bits D5 to D9 in this order, the voltage change of the data line 14 by the second DA conversion circuit unit Lwb is 1/32 of the voltage change of the data line 14 by the first DA conversion circuit unit Upb.

Thus, the DA conversion circuit 500 will change the data line 14 from a voltage at the end of the reset period by a voltage corresponding to the weights of the respective bits D0 to D9.

Figure 6:
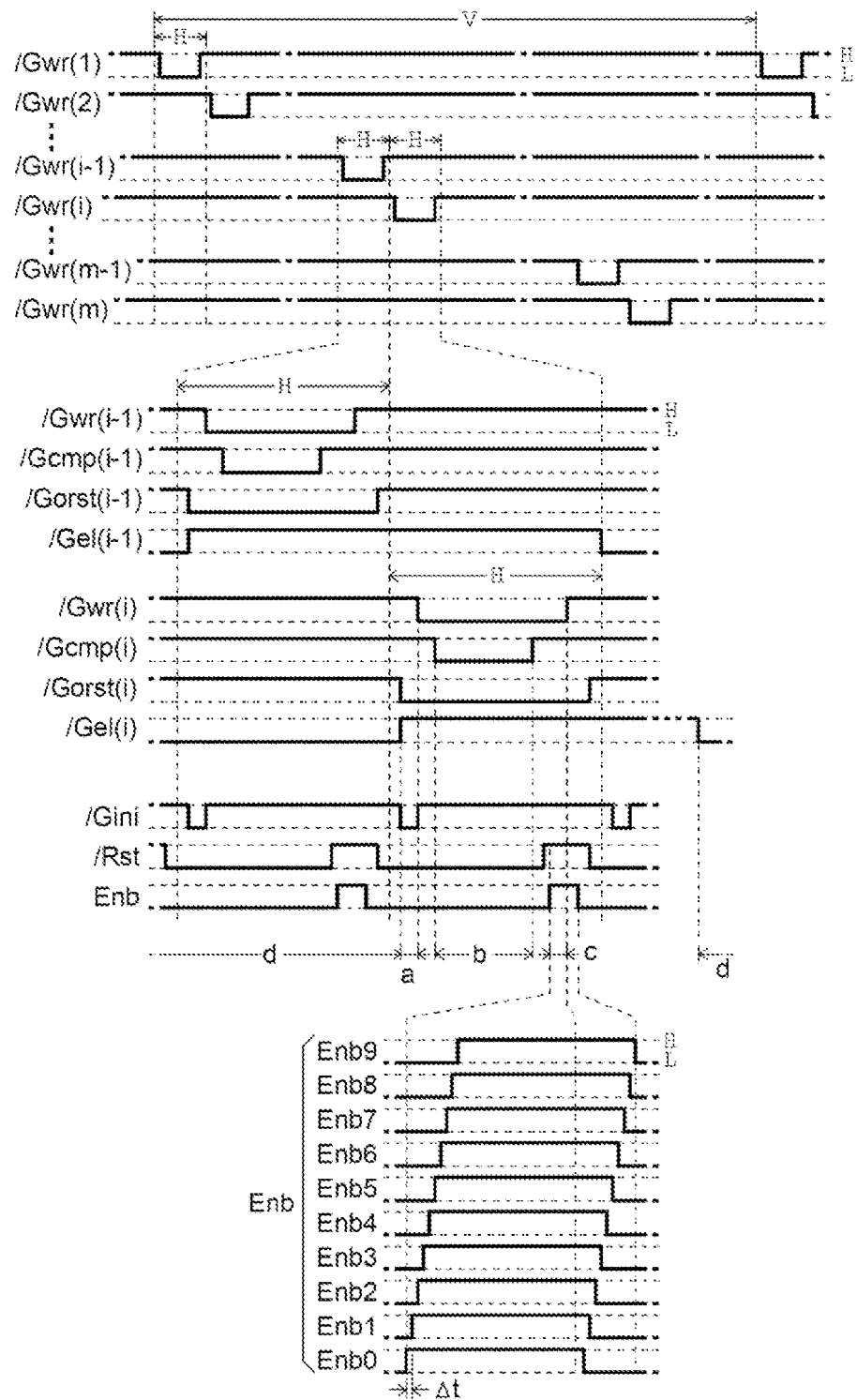
FIG. 6 is a timing chart illustrating operation of the electro-optical device.

FIG. 6 is a timing chart for explaining operation of the electro-optical device 10.

In the electro-optical device 10, the scanning lines 12 in the m rows are scanned one by one, in an order of the 1st, 2nd, 3rd, m-th row in a period of a frame (V). Specifically, as illustrated in the figure, the scanning signals/Gwr(1), /Gwr(2), . . . , /Gwr(m−1), /Gwr(m), and/Gwr(m), are sequentially and exclusively set to the L level, in each horizontal scanning period (H) by the scanning line driving circuit 120.

Note that, in the present exemplary embodiment, periods in which the scanning signals adjacent to each other, among the scanning signals/Gwr(1) to/Gwr(m), are set to the L level, respectively, are temporally isolated. Specifically, after a scanning signal/Gwr(i −1) changes from the L level to the H level, the next scanning signal /Gwr (i) is set to the L level after a period. This period corresponds to a horizontal blanking period.

In the present description, the period of one frame (V) refers to a period required to display a single frame of an image specified by the video data Vid. When a length of the one frame (V) is equal to a vertical synchronization period, for example, when a frequency of a vertical synchronization signal included in the synchronization signal Sync is 60 Hz, the length of the one frame (V) is 16.7 milliseconds corresponding to one cycle of the vertical synchronization signal. Further, the horizontal scanning period (H) is an interval of time during which the scanning signals/Gwr(1) to /Gwr(m) are sequentially set to the L level, but in the figure for convenience, start timing of the horizontal scanning period (H) is set almost at a center of the horizontal blanking period.

One horizontal scanning period (H) in the electro-optical device 10 is mainly divided into three periods of the initialization period (a), the compensation period (b), and the writing period (c). Further, as operation of the pixel circuit 110, a light emission period (d) is further added, separately from the three periods described above.

In each horizontal scanning period (H), in the initialization period (a), the control signal/Gini is at the L level, the control signal/Rst is at the L level, and the control signal Enb is at the L level. Note that, the control signal Enb is a signal collectively referred to as the control signals Enb0 to Enb9. The control signals Enb0 to Enb9 have respective phases that sequentially shift in the writing period (c) as described later, but have the same wave form in the other periods, thus are collectively referred to as the control signal Enb in this manner.

In the compensation period (b), the control signal/Gini is at the H level, and the control signals/Rst and Enb are kept to be at the L level.

In the writing period (c), the control signal/Gini is kept to be at the H level, and the control signals/Rst and Enb are set to the H level.

Operation in the horizontal scanning period (H) will be described using the i-th row as an example. In addition, the pixel circuit 110 will be described using the pixel circuit 110 in the i-th row and the j-th column as an example.

In the horizontal scanning period (H) of the i-th row, the initialization period (a) of the i-th row starts before the scanning signal/Gwr(i) is set to the L level. The initialization period (a) is a period for resetting a voltage or a charge remaining in each unit in the horizontal scanning period (H) of an (i−1)-th row.

Figure 7:
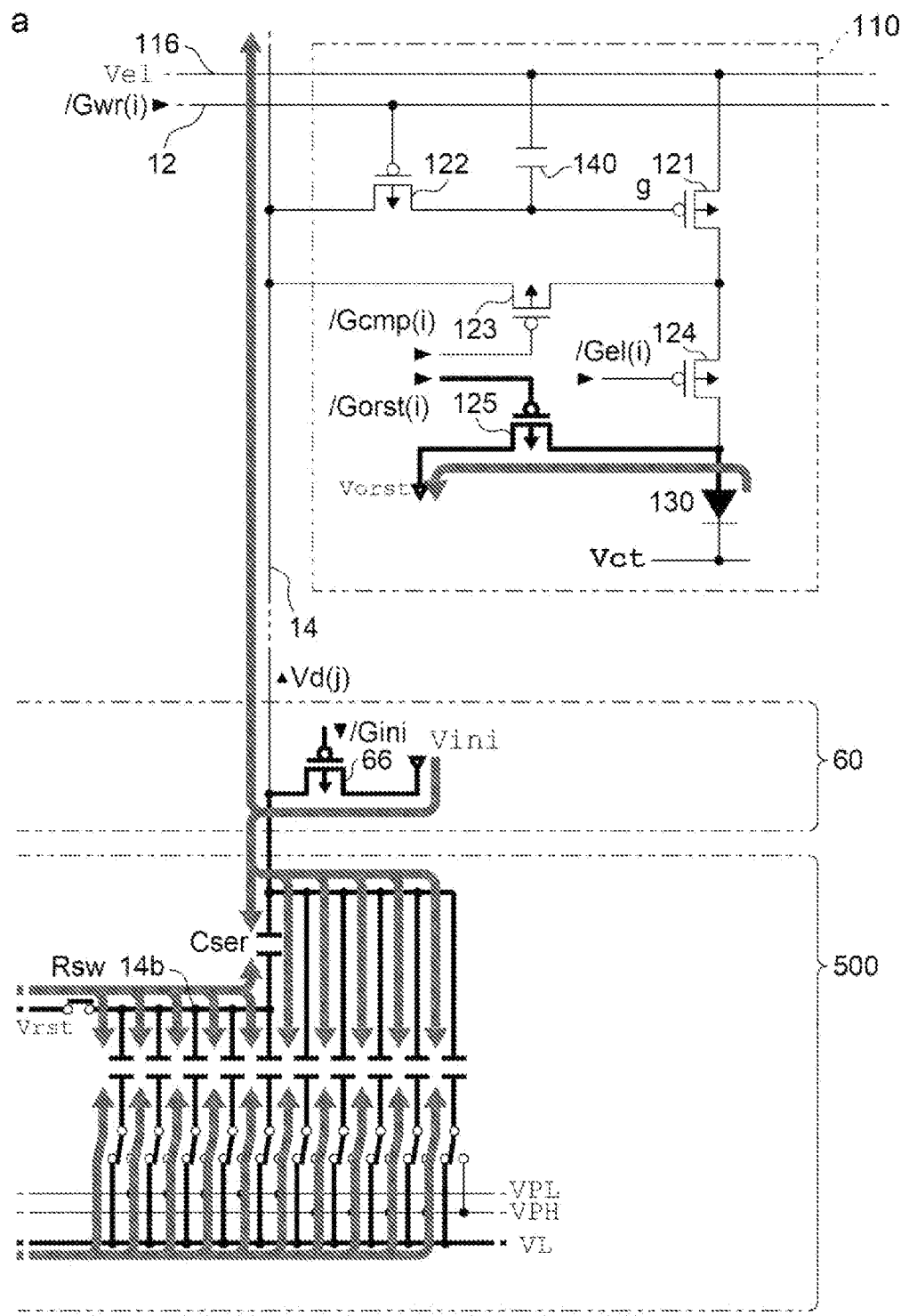
FIG. 7 is a diagram for explaining operation of the electro-optical device.

FIG. 7 is a diagram for explaining operation of the pixel circuit 110 in the i-th row and the j-th column, and the DA conversion circuit 500 corresponding to the data line 14 in the j-th column in the initialization period (a) of the i-th row.

In the initialization period (a), the transistor 66 is brought into the on state when the control signal/Gini is set to the L level, and thus the data line 14 is initialized to the potential Vini. In addition, in the initialization period (a), the switch Rsw is brought into the on state when the control signal/Rst is set to the L level, and thus the relay line 14b is set to the potential Vrst. In the initialization period (a), since the control signal Enb is at the L level, regardless of the respective logic levels of the bits D0 to D9 output from the second latching circuit L2, the logical product signal of the AND circuit Ds of each of the selection circuits 510 to 519 is set to the L level. Thus, the selection circuits 510 to 519 each select the potential VL.

Thus, in the initialization period (a), one end of each of the capacitance elements C0 to C9 is set to the potential VL, one end of the capacitance element Cser and another end of each of the capacitance elements C0 to C4 is set to the potential Vrst, and another end of the capacitance element Cser and another end of each of the capacitance elements C5 to C9 are set to the potential Vini via the data line 14. In this manner, in the initialization period (a), a charge stored in each of the capacitance elements C0 to C9 and Cser is initialized along with the initialization of the data line 14.

Additionally, in the initialization period (a) of the i-th row, the control signal/Gel (i) is set to the H level, and the control signal/Gorst(i) is set to the L level. Thus, in the pixel circuit 110 in the i-th row, the transistor 124 is brought into the off state, and the transistor 125 is brought into the on state, so the pixel electrode 131, which is the anode of the OLED 130, is set to the potential Vorst. Thus, the OLED 130 is turned off, and the pixel electrode 131 is reset to the potential Vorst.

Note that, the reason why the pixel electrode 131 is reset is to eliminate an effect of a voltage applied during an immediately preceding light emission period, because a capacitance parasitizes in the OLED 130.

After the initialization period (a) ends, the compensation period (b) follows. The compensation period (b) is a period for, in the n pixel circuits 110 located in the i-th row, causing a voltage of the gate node g of each transistor 121 to converge at a voltage corresponding to a threshold value of the transistor 121.

Figure 8:
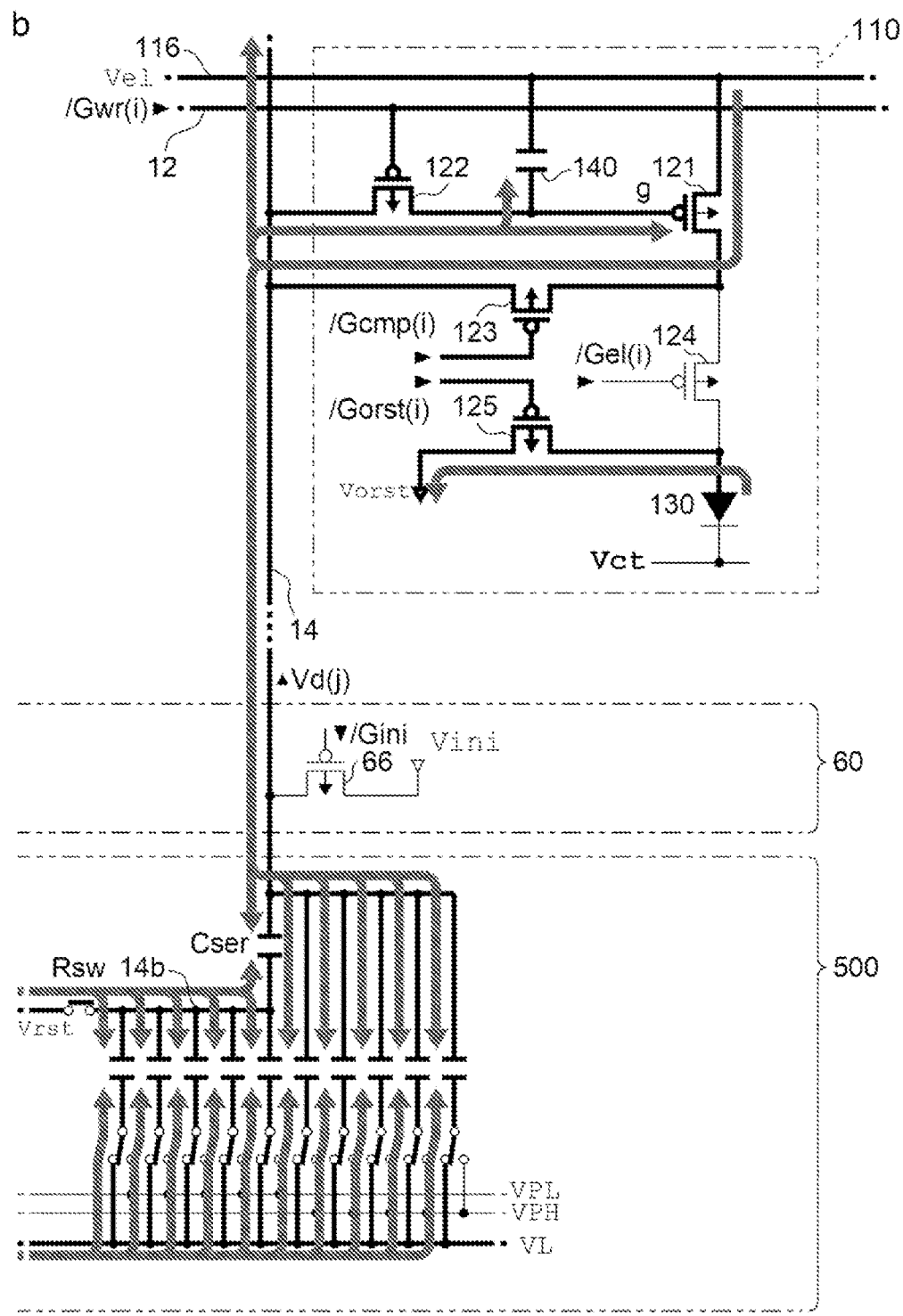
FIG. 8 is a diagram for explaining operation of the electro-optical device.

FIG. 8 is a diagram for explaining operation of the pixel circuit 110 in the i-th row and the j-th column, and the DA conversion circuit 500 corresponding to the data line 14 in the j-th column in the compensation period (b) of the i-th row.

In the compensation period (b), the control signal/Gini is set to the H level so that the transistor 66 is brought into the off state. Additionally, in the compensation period (b), the control signal/Rst is at the L level, the on state of the switch Rsw is maintained, and the control signal Enb is at the L level, thus the selection of the potential VL by the selection circuits 510 to 519 is maintained.

Additionally, in the compensation period (b) of the i-th row, the scanning signal/Gwr (i) is set to the L level, and the control signal/Gcmp(i) is set to the L level in the state of the L level. Thus, in the pixel circuit 110 in the i-th row, the transistor 122 is in the on state, and the transistor 123 is brought into the on state. Thus, since the transistor 121 is brought into a diode-coupled state, a voltage between the gate node and the source node in the transistor 121 converges at a voltage corresponding to a threshold value of the transistor 121 (threshold value equivalent voltage).

In the compensation period (b) of the i-th row, since the transistors 122 and 123 in the pixel circuit 110 are in the on state, the other end of the capacitance element Cser and the other end of each of the capacitance elements C5 to C9 also converge at the threshold value equivalent voltage of the transistor 121 via the data line 14.

Note that, in the compensation period (b), the one ends of the capacitance elements C0 to C9 are maintained at the potential VL by the selection circuits 510 to 519, respectively, and the other end of the capacitance element Cser and the other ends of the respective capacitance elements C0 to C4 are maintained at the potential Vrst by the on state of the switch Rsw. In addition, in the compensation period (b) of the i-th row, in the pixel circuit 110 in the i-th row, the off state of the transistor 124 and the on state of the transistor 125 continue from the initialization period (a).

The potential Vrst is set to an average threshold value equivalent voltage in the transistor 121 in each column. Therefore, at an end of the compensation period (b), a voltage applied to both ends of each of the capacitance elements C0 to C4 and a voltage applied to both ends of each of the capacitance elements C5 to C9 are approximately the same. Therefore, in the compensation period (b), it may be considered that a charge corresponding to a capacitance value is accumulated in each of the capacitance element C0 to C9.

After the compensation period (b) ends, the writing period (c) follows. The writing period (c) is a period for applying a voltage corresponding to luminance to the gate node g of each transistor 121 in the pixel circuit 110 in the n-th column located in the i-th row.

Figure 9:
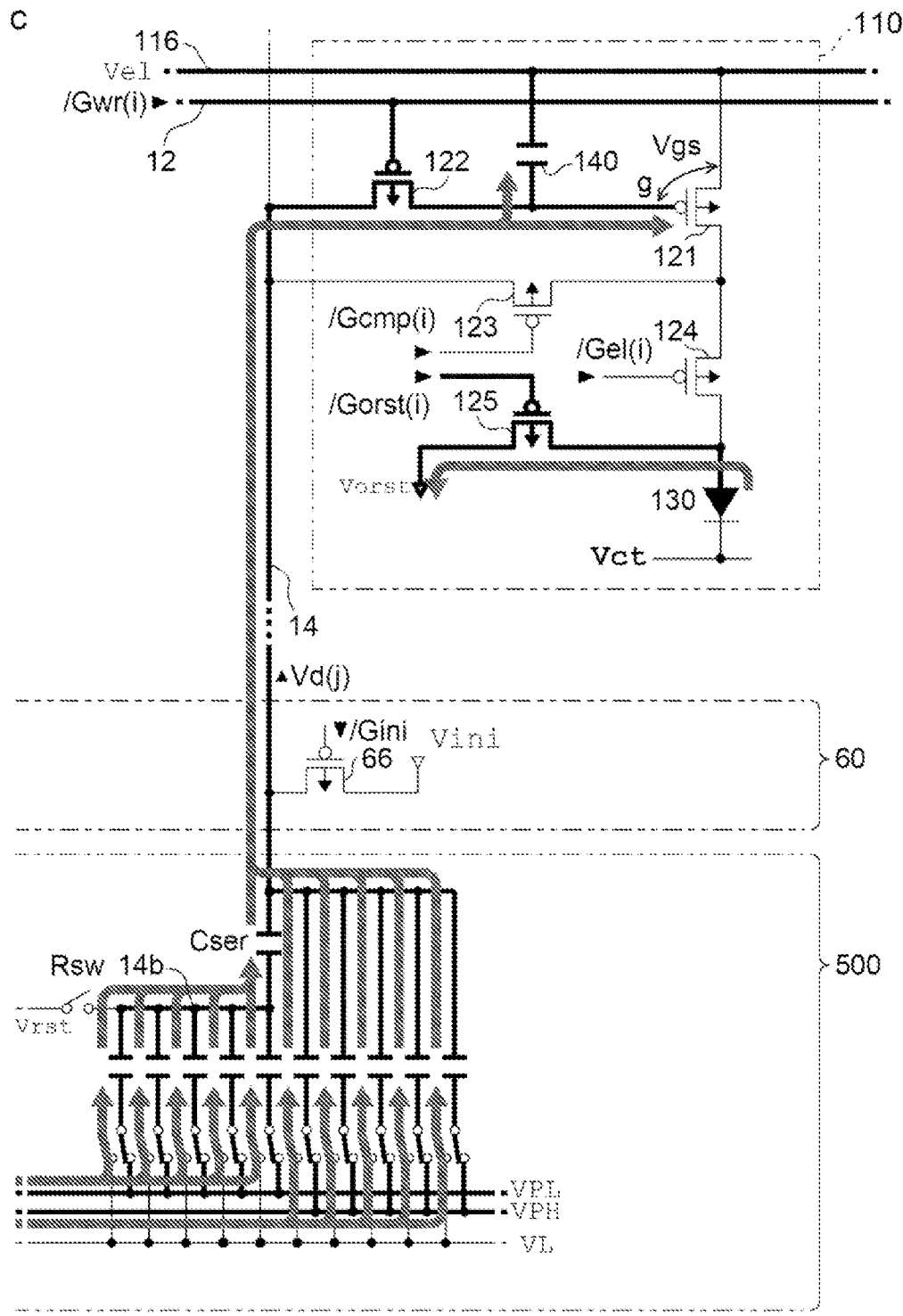
FIG. 9 is a diagram for explaining operation of the electro-optical device.

FIG. 9 is a diagram for explaining operation of the pixel circuit 110 in the i-th row and the j-th column, and the DA conversion circuit 500 corresponding to the data line 14 in the j-th column in the writing period (c) of the i-th row.

In the writing period (c), the control signal/Rst is set to the H level, and thus the switch Rsw is brought into the off state.

In addition, in the writing period (c), after the control signal Enb0 is set to the H level as illustrated in FIG. 6, the control signals Enb1 to Enb9 are sequentially delayed by a time ΔT and set to the H level. In addition, when the control signal Enb0 changes from the H level to the L level, the control signals Enb1 to Enb 9 are sequentially delayed by the time ΔT and set to the L level. Note that, the writing period (c) ends when all of the control signals Enb0 to Enb 9 are at the H level, and before the control signal Enb0 changes from the H level to the L level.

Of video data output from the second latching circuit L2 in the j-th column, a period in which the bit D0 is input to the level shifter Ls of the selection circuit 510 is limited by the AND circuit Ds to a period in which the control signal Enb0 is at the H level. Similarly, a period in which the bits D1 to D9 are sequentially input to the level shifters Ls in the selection circuits 511 to 519, respectively, is limited to a period in which the control signals Enb1 to Enb 9 are sequentially set to the H level by the AND circuits Ds. Thus, the bits D0 to D9 are taken in the selection circuits 510 to 519, respectively, not simultaneously, but are sequentially delayed by the time ΔT.

Of the selection circuits 510 to 514, a selection circuit in which a bit input to the level shifter Ls is "1" selects the potential VPL, and the selection circuit in which the bit is "0" selects the potential VL. Further, of the selection circuits 515 to 519, a selection circuit in which a bit input to the level shifter Ls is "1" selects the potential VPH, and a selection circuit in which the bit is "0" selects the potential VL.

In the writing period (c), a voltage of one end of a capacitance element, of the capacitance elements C0 to C9, corresponding to a bit of "0" input to the level shifter Ls does not change since the compensation period (b), and thus the capacitance element does not contribute to a voltage rise of the data line 14.

At one end of the capacitance element, of the capacitance elements C5 to C9 corresponding to the higher five bits, corresponding to a bit of "1" input to the level shifter Ls, the potential VL changes to the potential VPH in the writing period (c). Thus, the capacitance element, of the capacitance elements C5 to C9, corresponding to the bit of "1" causes a voltage of the data line 14 to rise from the threshold equivalent voltage in the compensation period (b), in accordance with an amount corresponding to a weight of the capacitance value.

At one end of the capacitance element, of the capacitance elements C0 to C4 corresponding to the lower five bits, corresponding to a bit of "1" input to the level shifter Ls, the potential VL changes to the potential VPL in the writing period (c). However, unlike the other ends of each of the capacitance elements C5 to C9, the capacitance element Cser is interposed between the other end of each of the capacitance elements C0 to C4 and the data line 14. Thus, an amount of change from the potential VL to the potential VPL at the one end of the capacitance element, of the capacitance elements C0 to C4, corresponding to the bit of "1" is compressed with the compression ratio k to raise the voltage of the data line 14.

In this manner, in the writing period (c), the DA conversion circuit 500 in the j-th column raises the voltage of the data line 14 in the j-th column from the threshold equivalent voltage by a voltage corresponding to the bit D0 to D9 of the video data Vdata in the i-th row and the j-th column, that is, a voltage that specifies luminance of the OLED in the i-th row and the j-th column.

In the present exemplary embodiment, in the writing period (c), the periods in which the control signals Enb0 to Enb9 are set to the H level, respectively, are sequentially delayed by the time ΔT. The reason for that is that when the control signals Enb0 to Enb 9 are collectively set to the H level, switching from the potential VL to VPL or VPH occurs at the same time, and a spike variation associated with the voltage switching increases, is propagated to each part, in particular, is propagated to the data line 14, and reduces DA conversion accuracy. Therefore, in the present exemplary embodiment, the phases of the respective control signals Enb0 to Enb9 are shifted sequentially so that the switching from the potential VL to VPL or VPH does not occur simultaneously.

According to the present exemplary embodiment, an effect of a voltage variation due to the spike in accordance with the voltage switching is reduced, and thus a decrease in the DA conversion accuracy is suppressed. Note that, an order in which the control signals Enb0 to Enb9 are set to the H level need not be an order of the control signals Enb0 to Enb9.

In the writing period (c) of the i-th row, in the pixel circuit 110 in the i-th row and the j-th column, the transistor 122 is kept in the on state, the transistor 123 is brought into the off state, and thus a potential Vd(j) output from the DA conversion circuit 500 in the j-th column is supplied via the data line 14 to the gate node g of the transistor 121.

In addition, in the writing period (c) of the i-th row, in the pixel circuit 110 in the i-th row, the off state of the transistor 124 and the on state of the transistor 125 still continue.

When the scanning signal/Gwr(i) changes to the H level, the writing period (c) of the i-th row ends. When the scanning signal /Gwr(i) is set to the H level, the transistor 122 is brought into the off state in the pixel circuit 110 in the i-th row and the j-th column, but a voltage of a difference between the potential Vd(j) of the gate node g and the potential Vel is retained in the capacitance element 140. Note that, in FIG. 9, the voltage of the difference between the potential Vd(j) of the gate node g and the potential Vel is denoted as Vgs. Furthermore, the figure illustrates a case in which all of the bits D0 to D9 of the video data output from the second latching circuit L2 are "1".

After the writing period (c) ends, the light emission period (d) follows. The light emission period (d) is a period for causing a current corresponding to the voltage Vgs retained in the writing period (c) to flow through the OLED 130 to emit light.

Figure 10:
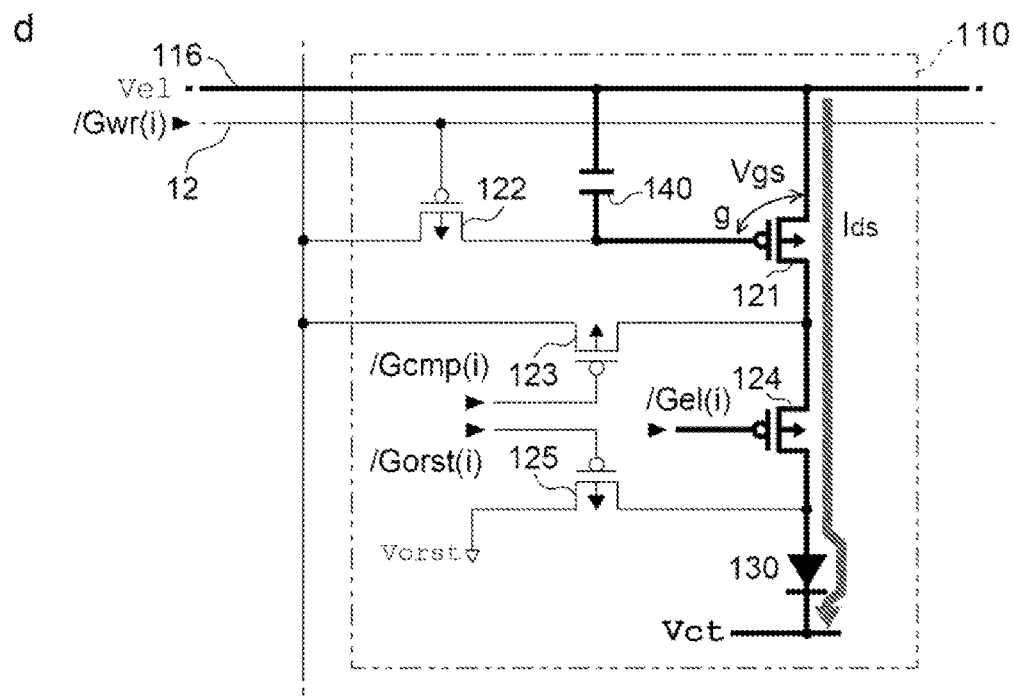
FIG. 10 is a diagram for explaining operation of the electro-optical device.

FIG. 10 is a diagram for explaining operation of the pixel circuit 110 in the i-th row and the j-th columns in the light emission period (d) of the i-th row.

Before the light emission period (d) of the i-th row, the control signal/Gorst(i) is set to the H level, and thus the transistor 125 is brought into the off state. In addition, when the light emission period (d) of the i-th row is reached, the control signal /Gel(i) is reversed to the L level, and thus the transistor 124 is brought into the on state. Thus, a current Ids in accordance with the voltage Vgs retained by the capacitance element 140 is caused to flow through the OLED 130 by the transistor 121. Thus, the OLED 130 is brought into an optical state in accordance with the current Ids, that is, a state of emitting light with luminance in accordance with the current Ids.

Note that, FIG. 10 is an example in which the light emission period (d) is continuous after the end of selection of the scanning line 12 in the i-th row, but the period in which the control signal /Gel (i) is set to the L level may be intermittent, or may be adjusted in accordance with luminance adjustment. Furthermore, the level of the control signal/Gel(i) in the light emission period (d) may be raised from the L level in the compensation period (b). That is, an intermediate level between the H level and the L level may be used for the level of the control signal/Gel(i) in the light emission period (d).

In addition, in the light emission period (d) of the i-th row, the DA conversion circuit 500 corresponding to the j-th column performs the operation of the horizontal scanning period (H) of the rows other than the i-th row, and thus the DA conversion circuit 500 is omitted in FIG. 10.

In FIG. 7 to FIG. 9, in the horizontal scanning period (H) of the i-th row, the DA conversion circuit 500 corresponding to the j-th column and the pixel circuit 110 in the i-th row and the j-th column have been focused, but similar operation is performed for the DA conversion circuit 500 and the pixel circuit 110 corresponding to the other columns other than the j-th column.

Also, in FIG. 7 to FIG. 9, the horizontal scanning period (H) of the i-th row has been focused, while the operation of the horizontal scanning period (H) has been described, but similar operation is performed sequentially for the horizontal scanning periods (H) of the 1st, 2nd, 3rd, . . . , m-th rows.

In the pixel circuit 110, the voltage Vgs in the writing period (c) and the light emission period (d) is a voltage that is changed in accordance with a gray scale level of the pixel circuit 110 from a threshold voltage in the compensation period (b). Since similar operation is performed for the other pixel circuits 110, in the first exemplary embodiment, a current corresponding to a gray scale level flows through the OLED 130 with a threshold value of the transistor 121 being compensated for, for all of the pixel circuits 110 in the m rows by n columns. Thus, in the present exemplary embodiment, a variation in luminance is reduced, as a result, high-quality display is possible.

By the way, in the actual electro-optical device 10, a capacitance parasitizes in each part. For example, as illustrated by a dashed line in FIG. 4 or FIG. 5, a capacitance Cp parasitizes in the relay line 14b. When the capacitance Cp parasitizes in the relay line 14b, and at one ends of the respective capacitance elements C0 to C4, the potential VL changes to the potential VPL, some of charges discharged from another ends of the respective capacitance elements C0 to C4 are used to charge the capacitance Cp. In other words, all of the charges discharged from the other ends of the respective capacitance elements C0 to C4 do not head toward the capacitance element Cser, and some of the charges leak to the capacitance Cp.

Thus, in this manner, the second DA conversion circuit unit Lwb does not change a potential of the relay line 14b to a potential corresponding to weights of the respective bits D0 to D4 from the potential Vrst. Thus, characteristics for compressing the voltage change of the relay line 14b with the compression ratio k (=1/32) to change the voltage of the data line 14, and characteristics for the first DA conversion circuit unit Upb to change the voltage of the data line 14 in accordance with the weights of the respective bits D5 to D9 do not match.

Figure 11:
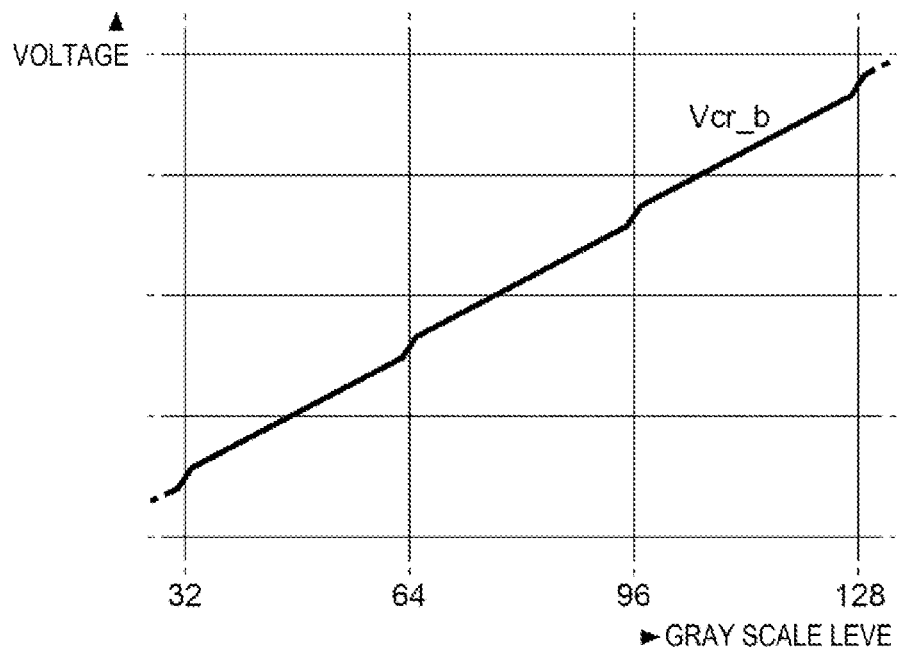
FIG. 11 is a diagram illustrating output characteristics of the DA conversion circuit.

Specifically, voltage characteristics are the same as characteristics Vcr_b indicated by a solid line in FIG. 11, when a horizontal axis indicates decimal value of a gray scale level indicated by the ten bits of the bits D0 to D9, and a vertical axis indicates amount of rise from the voltage of the data line 14 at the end of the reset period in the DA conversion circuit 500. In particular, every 2 to the fifth power (=32) in decimal notation of the gray scale level, a location occurs in which linearity in characteristics of output voltage is disturbed, and rises.

Note that, the characteristics Vcr_b are an example when a capacitance value of the capacitance element Cser is the same as that of the capacitance element C5 (C0), and VPL=VPH=4.0 V.

In FIG. 11, for example, the linearity of the voltage characteristics in gray scale level intervals of "0" to "31", "33" to "63", "65" to "95", "97" to "127", . . . , results from the compression of the output voltage from the second DA conversion circuit Lwb with the compression ratio k. Also in FIG. 11, a voltage at each of discrete points where the gray scale levels are "32", "64", "96", "128", . . . , is a voltage output from the first DA conversion circuit Upb. Thus, as illustrated in FIG. 11, the reason that the linearity of the voltage characteristics output from the DA conversion circuit 500 is disturbed is because an inclination of the voltage characteristics obtained by compressing the voltage output from the second DA conversion circuit unit Lwb with the compression ratio k is reduced due to the effect of the capacitance Cp parasitizing in the relay line 14b, and does not match an inclination of the voltage characteristics output from the first DA conversion circuit unit Upb that is not affected by the capacitance Cp.

Accordingly, in the first exemplary embodiment, a configuration is adopted for setting the potential VPL to be higher than the potential VPH, and compensating for the reduction of the inclination of the characteristics obtained by compressing the voltage output from the second DA conversion circuit unit Lwb with the compression ratio k due to the effect of the capacitance Cp parasitizing in the relay line 14b.

Specifically, the potential VPL is set to 4.5 V, and the potential VPH is set to 4.0 V. The characteristics of output voltage from the DA conversion circuit 500 according to this setting are the same as characteristics Vcr_a indicated by a solid line in FIG. 12. Note that, the characteristics Vcr_b indicated by a dashed line in FIG. 12 are the characteristics Vcr_b indicated by the solid line in FIG. 11, and are described for comparison.

Figure 12:
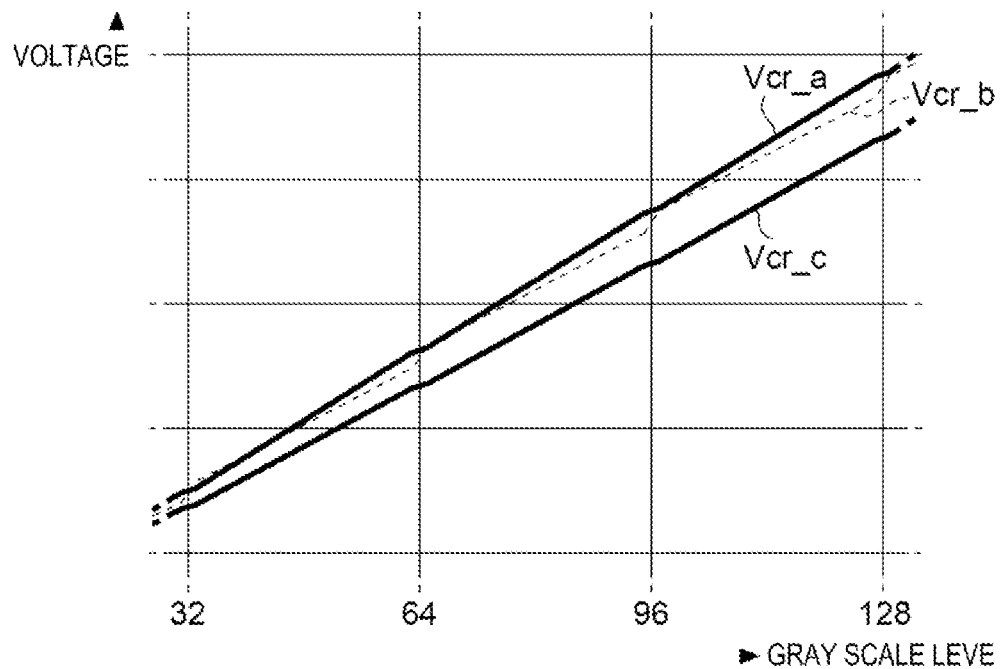
FIG. 12 is a diagram illustrating output characteristics of a DA conversion circuit according to a second exemplary embodiment.

As shown in FIG. 12, it is found that, in the characteristics Vcr_a indicated by the solid line, linearity is improved compared to the characteristics Vcr_b indicated by the dashed line.

When VPL and VPH are appropriately reduced while maintaining a relationship of VPL>VPH, while linearity of the characteristics of output voltage is improved, an inclination of the voltage characteristics is decreased. Conversely, when VPL and VPH are appropriately raised while the relationship of VPL>VPH is maintained, while the linearity of the characteristics of output voltage is improved, the inclination of the voltage characteristics is increased. In FIG. 12, characteristics Vcr_c indicated by a solid line are an example in which the potential VPL is set to 4.0 V, and the potential VPH is set to 3.7 V, and is an example in which the inclination is decreased, compared to the characteristics Vcr_a. Note that, when the inclination of the voltage characteristics output increases, a voltage difference per bit increases, and thus it is easy to ensure required voltage amplitude.

When the capacitance Cp parasitizes in the relay line 14b, and VPL=VPH, the linearity in the characteristics of output voltage from the DA conversion circuit 500 is impaired, and display quality of the electro-optical device 10 is reduced. In contrast, according to the first exemplary embodiment, when the capacitance Cp parasitizes in the relay line 14b, VPL>VPH is set, and thus the linearity in the characteristics of output voltage from the DA conversion circuit 500 is ensured, and the reduction in display quality of the electro-optical device 10 can be suppressed.

Note that, the potential VL is an example of a first potential, the potential VPH is an example of a second potential, and the potential VPL is an example of a third potential. That is, the first exemplary embodiment is an example of the configuration in which the potential VPL, which is the third potential, is higher than the potential VPH, which is the second potential.

Note that, examples of a cause of impaired linearity of the voltage characteristics in the DA conversion circuit 500 include, in addition to parasitism of the capacitance Cp in the relay line 14b, voltage dependence of a capacitance value when an MOS capacitance is used as the capacitance elements C0 to C4. Specifically, the MOS capacitance has a property that charge density in a depletion layer of a semiconductor layer used as an electrode changes in accordance with an applied voltage, thereby varying a capacitance value. Even with such voltage dependence of the capacitance value, in the present exemplary embodiment, the linearity of the voltage characteristics in the DA conversion circuit 500 can be ensured.

Second Exemplary Embodiment

Next, the DA conversion circuit 500 according to a second exemplary embodiment will be described. Note that, in the following, the same components as those in the above-described exemplary embodiment are denoted with the same reference numerals, and detail description thereof is omitted.

In the first exemplary embodiment described above, the ratio of the capacitance value in the capacitance element Cser is "1", which is the same as the ratio of the capacitance value of the capacitance element C5 (C0), but may be other than "1". Specifically, the ratio of the capacitance value of the capacitance element Cser may be greater than the ratio of the capacitance value of the capacitance element C5 (C0). However, when the capacitance value of the capacitance element Cser is greater than the capacitance value of the capacitance element C5 (C0), the compression ratio k is greater than 1/32 as can be seen by Equation (1).

Therefore, in the configuration in which the ratio of the capacitance value in the capacitance element Cser is simply made greater than "1", the linearity of the voltage characteristics output by the DA conversion circuit 500 is impaired.

Figure 13:
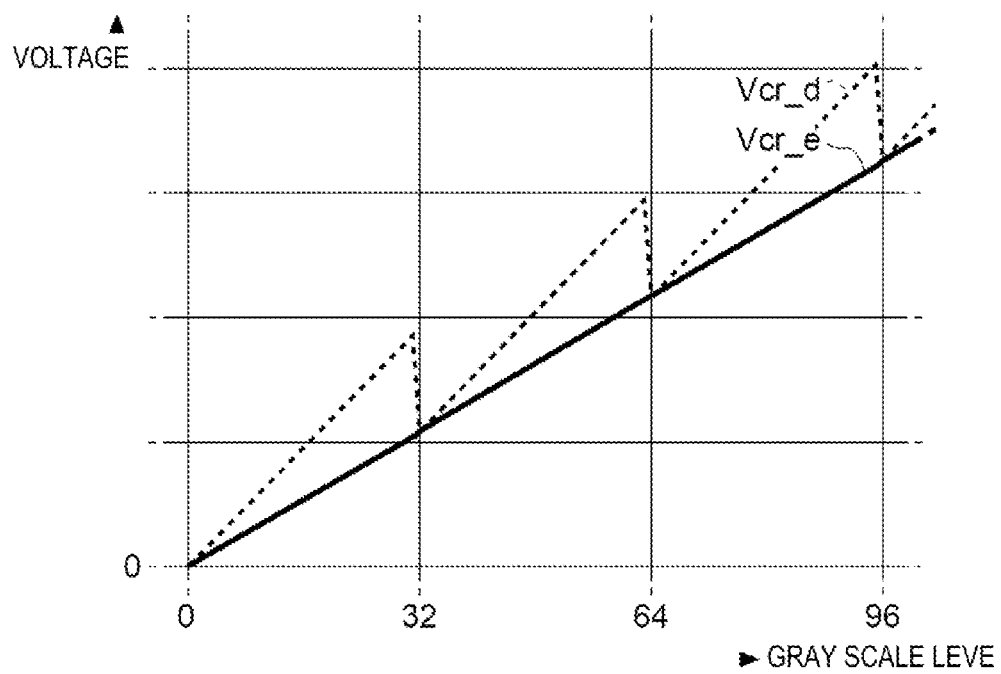
FIG. 13 is a diagram illustrating output characteristics of a DA conversion circuit according to a third exemplary embodiment.

Specifically, voltage characteristics are the same as characteristics Vcr_d indicated in FIG. 13, when a horizontal axis indicates decimal value of the bits D0 to D9, and a vertical axis indicates amount of rise from the voltage of the data line 14 at the end of the reset period in the DA conversion circuit 500. In other words, every 2 to the fifth power (=32) of a gray scale level, an output voltage falls. Note that, the characteristics indicated by a dashed line Vcr_d are an example of a case in which VPL=VPH=4.0 V, and the capacitance value of the capacitance element Cser is twice the capacitance value of the capacitance element C5 (C0).

When the output voltage falls in this manner, for example, luminance of a display element when a gray scale level is "31" is to be lower than luminance of the display element when the gray scale level is "32", but in practice, a reverse phenomenon occurs in which, the luminance of the display element when the gray scale level is "31" is higher than the luminance of the display element when the gray scale level is "32". Such a reverse phenomenon may be referred to as a gray scale level reversal since brightness/darkness in accordance with a gray scale level is reversed and light is emitted with luminance of darkness/brightness in a display element. When the reverse phenomenon (gray scale level reversal) occurs, display quality is significantly impaired.

Thus, in the second exemplary embodiment, the capacitance value of the capacitance element Cser is set to, for example, twice the capacitance value of the capacitance element C5 (C0), and the potential VPL is set to be lower than the potential VPH in contrast to the first exemplary embodiment. When the capacitance value of the capacitance element Cser is twice the capacitance value of the capacitance element C5 (C0), the compression ratio k is ⅔₃ (=1/(2+1+2+4+8+16). At this time, when the potential VPL is set to be lower than the potential VPH, and for example, only the D0 and D5 are "1" of the bits D0 to D9, an amount of rise at the other end of the capacitance element C0 corresponding to the bit D0 is lower compared to an amount of rise at the other end of the capacitance element C5 corresponding to the bit D5. Here, although the relationship between the capacitance elements C0 and C5 has been described, the same applies to the other capacitance elements having the same ratio of capacitance value, specifically, to the capacitance elements C1 and C6, the capacitance elements C2 and C7, the capacitance elements C3 and C8, and the capacitance elements C4 and C9.

In this way, when the potential VPL is lower than the potential VPH, the amount of rise at the other end of each of the capacitance element C0 to C4 is lower than the amount of rise at the other end of each of the capacitance element C5 to C9, and an effect due to the increase of the compression ratio k is canceled. Thus, when the potential VPL is set to be appropriately lower than the potential VPH, the linearity in the characteristics of output voltage is ensured as characteristics indicated by a solid line Vcr_e in FIG. 13, a reduction of display quality of the electro-optical device 10 can be suppressed.

Note that, the characteristics indicated by the solid line Vcr_e in FIG. 13 are an example of a case in which the capacitance value of the capacitance element Cser is twice the capacitance value of the capacitance element C5 (C0), and a case in which the potential (voltage) VPL is 2.2 V, and the potential VPH is 4.0 V.

When a case in which the potential VPL=the potential VPH is used as a reference, it is also conceivable to maintain the potential VPL to make the potential VPH higher than the potential VPL, in order to lower the potential VPL relative to the potential VPH. However, there is a case in which it is not possible to raise the potential of the potential VPH due to the configuration of the power supply circuit 15, and thus the method of lowering the potential VPL is effective.

Note that, the second exemplary embodiment is an example of the configuration in which the potential VPL, which is the third potential, is lower than the potential VPH, which is the second potential.

Third Exemplary Embodiment

Next, the DA conversion circuit 500 according to a third exemplary embodiment will be described.

Figure 14:
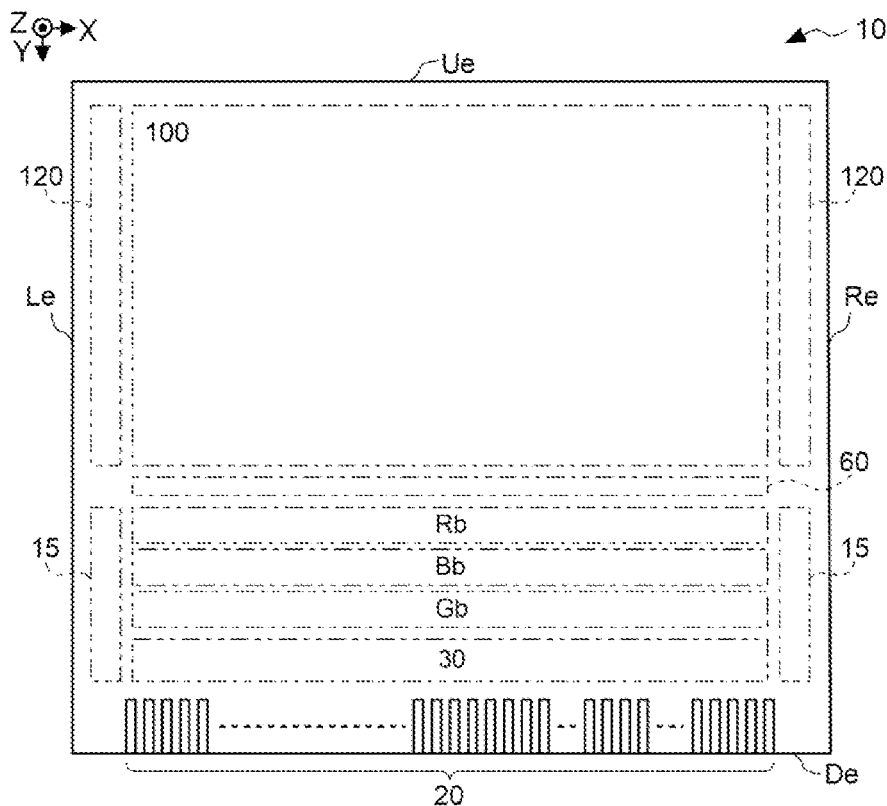
FIG. 14 is a plan view illustrating an arrangement of each element in the electro-optical device.

FIG. 14 is a plan view illustrating an arrangement of each element in the electro-optical device 10. The electro-optical device 10 has a rectangular shape because the electro-optical device 10 is diced from a wafer-shaped semiconductor substrate. Therefore, in the electro-optical device 10 having the rectangular shape, a reference numeral of an upper side is Ue, a reference numeral of a lower side is De, a reference numeral of a left side is Le, and a reference numeral of a right side is Re.

Note that, in the electro-optical device 10 having the rectangular shape, the upper side Ue and the lower side De are along the X direction, which is an extension direction of the scanning line 12, and the left side Le and the right side Re are along the Y direction, which is an extension direction of the data line 14. In addition, in the present description, viewing in plan view refers to a case where the electro-optical device 10 is viewed in a direction opposite to the Z direction.

The scanning line driving circuit 120 is provided in a region between the display region 100 and the left side Le, and the scanning line driving circuit 120 is provided in a region between the display region 100 and the right side Re. The two scanning line driving circuits 120 have the same configuration, and drive the scanning lines 12 from left and right. In a configuration in which the scanning line driving circuit 120 is arranged only on one of the left and right sides, a signal delay occurs on another of the left and right sides. In contrast, in the configuration in which the scanning line driving circuits 120 are arranged on both the left and right sides, a signal delay can be prevented.

In the electro-optical device 10, a plurality of terminals 20 to be coupled to one end of the FPC substrate 194 are provided along the lower side De. In a region between the display region 100 and the plurality of terminals 20, the initialization circuit 60, circuits Rb, Bb, GB, and the control circuit 30 are provided in order from the display region 100.

The circuit Rb is a circuit in which, among the data signal output circuits 50 each including the selection circuit group 52, the first latching circuit group 54, the second latching circuit group 56, and the DA conversion circuit 500, those that correspond to the data line 14 of R are aggregated. The circuit Bb is a circuit in which, among the data signal output circuits 50, those that correspond to the data line 14 of B are aggregated. The circuit Gb is a circuit in which, among the data signal output circuits 50, those that correspond to the data line 14 of G is aggregated.

The power supply circuit 15 is provided in a region between the initialization circuit 60, the circuits Rb, Bb, Gb, and the control circuit 30, and the left side Le, and the power supply circuit 15 is also provided in a region between the initialization circuit 60, the circuits Rb, Bb, Gb, and the control circuit 30, and the right side Re. The two power supply circuits 15 have the same configuration, and supply various potentials and voltages to the scanning line driving circuit 120, the initialization circuit 60, the circuits Rb, Bb, Gb, and the control circuit 30.

Figure 15:
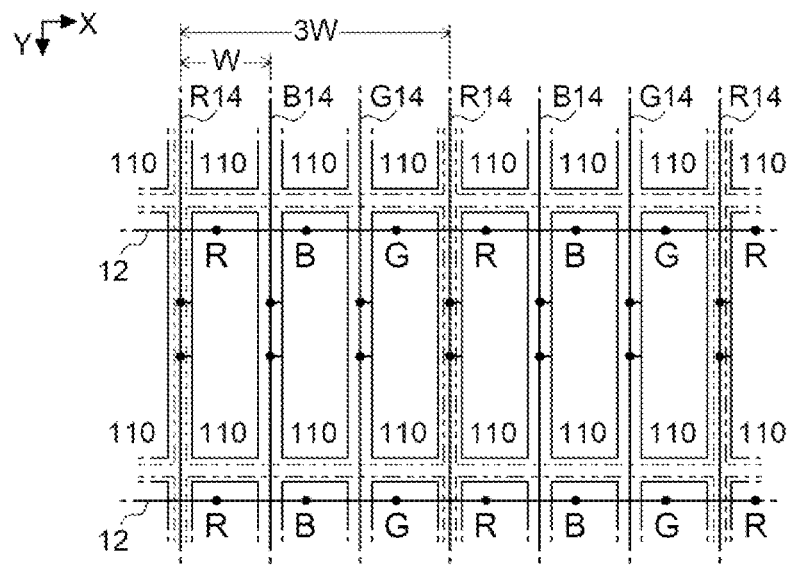
FIG. 15 is a diagram illustrating an array of pixel circuits in the electro-optical device.

FIG. 15 is a plan view illustrating an arrangement of the pixel circuits 110 in the display region 100.

As illustrated in this figure, the pixel circuit 110 of R, the pixel circuit 110 of B, and the pixel circuit 110 of G are arrayed along the X direction, and the pixel circuits 110 of the same color are arrayed along the Y direction. Thus, focusing on the data line 14 in any one column, the data line 14 corresponds to the pixel circuits 110 of the same color.

Note that, one color is represented by additive color mixing of the pixel circuits 110 of RBG adjacent to each other in the X direction. Thus, strictly speaking, the pixel circuit 110 is to be referred to as a sub-pixel circuit, but in the present description, as described above, a display of a monochrome image only with brightness and darkness is also possible, and thus, the pixel circuit 110 is referred to as a pixel circuit without being distinguished.

In the figure, a width W is an array interval between the data lines 14 when viewed in the X direction. A width 3W is three times the width W, that is an interval when the data lines 14 in three columns required to display one color form one unit.

In addition, in order to distinguish the data lines 14 per color, in the figure, a reference numeral of a data line corresponding to the pixel circuit 110 of R is denoted as R14, and a reference sign of a data line corresponding to the pixel circuit 110 of B is denoted as B14, and a reference sign of a data line corresponding to the pixel circuit 110 of G is denoted as G14.

Figure 16:
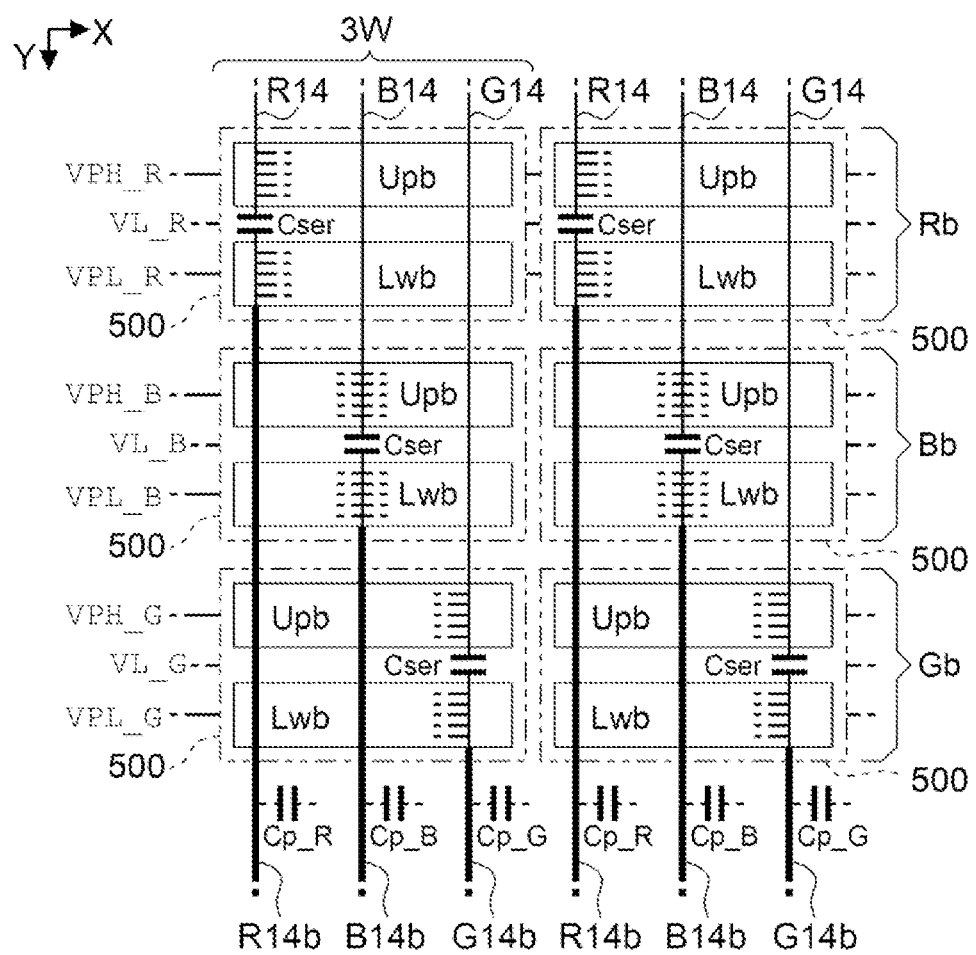
FIG. 16 is a diagram illustrating an arrangement of a data signal output circuit in a fourth exemplary embodiment.

FIG. 16 is a diagram illustrating an arrangement of each element in the DA conversion circuits 500 in six columns adjacent to each other in the circuits Rb, Bb, and Gb, of the data signal output circuit 50. Note that, in this figure, the selection circuit 520, the first latching circuit L1, and the second latching circuit L2 are not illustrated.

As illustrated in the figure, the DA conversion circuit 500 in the circuit Rb, the DA conversion circuit 500 in the circuit Bb, and the DA conversion circuit 500 in the circuit Gb are arrayed on a line along the Y direction in a range that is wider than the width W, and is narrower than the width 3W.

Specifically, in the DA conversion circuit 500 in the circuit Rb, the first DA conversion circuit unit Upb, the capacitance element Cser, and the second DA conversion circuit unit Lwb are arrayed in the Y direction in this order. In other words, the capacitance element Cser is provided between the first DA conversion circuit unit Upb and the second DA conversion circuit unit Lwb. One end of the capacitance element Cser in the circuit Rb is coupled to a relay line R14*b* of R provided along the Y direction, and another end of the capacitance element Cser is coupled to the data line R14 of R.

Potentials VPH_R, VL_R, and VPL_R are supplied to the first DA conversion circuit unit Upb and the second DA conversion circuit unit Lwb of the circuit Rb via each power supplying line extending along the X direction. Specifically, in the circuit Rb, the potentials VPH_R and VL_R are supplied to the first DA conversion circuit unit Upb, and the potentials VL_R and VPL_R are supplied to the second DA conversion circuit unit Lwb. The potential VPH_R is the potential VPH described without restricting a color, used exclusively for R, and supplied by the power supply circuit 15 in an adjustable manner. Similarly, the potential VL_R is the potential VL described without restricting a color, and used exclusively for R, and the potential VPL_R is the potential VPL described without restricting a color, and used exclusively for R, and any of these is supplied by the power supply circuit 15, in an adjustable manner.

Note that, in addition to the potential VPH_R and the VL_R, the bits D5 to D9 and the control signals Enb 5 to Enb 9 are supplied to the first DA conversion circuit unit Upb of the circuit Rb, via each wiring line, not illustrated, provided along the Y direction from below in the figure, for example. Also, in addition to the potential VL_R and the VPL_R, the bits D0 to D4 and the control signals Enb0 to Enb4 are supplied to the second DA conversion circuit unit Lwb of the circuit Rb, via each wiring line provided along the Y direction in the figure, for example, and the potential Vrst and the control signal/Rst are supplied via each wiring line, not illustrated, provided along the X direction.

In the circuit Bb, the first DA conversion circuit unit Upb, the capacitance element Cser, and the second DA conversion circuit unit Lwb are arrayed in the Y direction in this order. One end of the capacitance element Cser in B is coupled to a relay line B14*b* of B provided along the Y direction, and another end of the capacitance element Cser is coupled to the data line B14 of B.

Potentials VPH_B, VL_B, and VPL_B are supplied to the first DA conversion circuit unit Upb and the second DA conversion circuit unit Lwb of the circuit Bb via each power supplying line extending along the X direction. Specifically, in the circuit Bb, the potentials VPH_B and VL_B are supplied to the first DA conversion circuit unit Upb, and the potentials VL_B and VPL_B are supplied to the second DA conversion circuit unit Lwb. The potential VPH_B is the potential VPH used exclusively for B, and supplied by the power supply circuit 15 in an adjustable manner. Similarly, the potential VL_B is the potential VL, and used exclusively for B, and the potential VPL_B is the potential VPL, and used exclusively for B, and both are supplied by the power supply circuit 15, in an adjustable manner.

Note that, in addition to the potential VPH_B and the VL_B, the bits D5 to D9 and the control signals Enb 5 to Enb 9 are supplied to the first DA conversion circuit unit Upb of the circuit Bb, via each wiring line, not illustrated, provided along the Y direction from below in the figure, for example. Also, in addition to the potential VL_B and the VPL_B, the bits D0 to D4 and the control signals Enb0 to Enb4 are supplied to the second DA conversion circuit unit Lwb of the circuit Bb, via each wiring line provided along the Y direction in the figure, for example, and the potential Vrst and the control signal/Rst are supplied via each wiring line, not illustrated, provided along the X direction.

In the circuit Gb, the first DA conversion circuit unit Upb, the capacitance element Cser, and the second DA conversion circuit unit Lwb are arrayed in the Y direction in this order. One end of the capacitance element Cser in B is coupled to a relay line G14*b* of G provided along the Y direction, and another end of the capacitance element Cser is coupled to the data line G14 of G.

Potentials VPH_G, VL_G, and VPL_G are supplied to the first DA conversion circuit unit Upb and the second DA conversion circuit unit Lwb of the circuit Gb via each power supplying line extending along the X direction. Specifically, in the circuit Gb, the potentials VPH_G and VL_G are supplied to the first DA conversion circuit unit Upb, and the potentials VL_G and VPL_G are supplied to the second DA conversion circuit unit Lwb. The potential VPH_G is the potential VPH used exclusively for B, and supplied by the power supply circuit 15 in an adjustable manner. Similarly, the potential VL_G is the potential VL, and used exclusively for G, and the potential VPL_G is the potential VPL, and used exclusively for G, and both are supplied by the power supply circuit 15, in an adjustable manner.

Note that, in addition to the potential VPH_G and the VL_G, the bits D5 to D9 and the control signals Enb 5 to Enb 9 are supplied to the first DA conversion circuit unit Upb of the circuit Gb, via each wiring line, not illustrated, provided along the Y direction from below in the figure, for example. Also, in addition to the potential VL_G and the VPL_G, the bits D0 to D4 and the control signals Enb0 to Enb4 are supplied to the second DA conversion circuit unit Lwb of the circuit Gb, via each wiring line provided along the Y direction in the figure, for example, and the potential Vrst and the control signal/Rst are supplied via each wiring line, not illustrated, provided along the X direction.

In such a configuration, the first DA conversion circuit unit Upb in the circuit Rb intersects, in addition to the data line R14 corresponding to own color thereof, the data line B14 and G14 corresponding to the other colors. Similarly, the second DA conversion circuit unit Lwb in the circuit Rb intersects, in addition to the relay line R14*b* corresponding to own color thereof, the data line B14 and G14 corresponding to the other colors.

The first DA conversion circuit unit Upb in the circuit Bb intersects, in addition to the data line B14 corresponding to own color thereof, the relay line R14b and the data line G14 of the other colors. Similarly, the second DA conversion circuit unit Lwb in the circuit Bb intersects, in addition to the relay line B14b corresponding to own color thereof, the relay line R14b and the data line G14 of the other colors.

The first DA conversion circuit unit Upb in the circuit Gb intersects, in addition to the data line G14 corresponding to own color thereof, the relay line R14b and B14b of the other colors. Similarly, the second DA conversion circuit unit Lwb in the circuit Gb intersects, in addition to the relay line G14b corresponding to own color thereof, the relay line R14b and B14b of the other colors.

In a semiconductor substrate, when laying out various elements, wiring lines, and the like, it is efficient to make a certain range into a block, and arrange the block repeatedly. Further, a configuration may be adopted in which, the relay lines R14b, B14b, and G14b are coupled to an inspection circuit (not illustrated) separately provided in the electro-optical device 10, so that defects in a manufacturing process can be inspected.

Therefore, a configuration may be adopted in which, as illustrated in FIG. 16 by a thick line, although redundant, the relay lines R14b, B14b, and G14b are extended in the Y direction, and coupled to an inspection circuit provided below in the figure, for example. Note that, the redundancy referred to here means that a part of the thick line is unnecessary, as long as the relay lines R14b, B14b, and G14b are used only to achieve the function of the DA conversion in the DA conversion circuit 500.

In such a configuration, respective lengths of the relay lines R14b, B14b, and G14b are ordered as R14b>B14b>G14b. Therefore, respective sizes of a capacitance Cp_R parasitizing in the relay line R14b, a capacitance Cp_B parasitizing in the relay line B14b, and a capacitance Cp_G parasitizing in the relay line G14b are also ordered as Cp_R>Cp_B>Cp_G.

Therefore, if the potentials are set as VL_R=VL_B=VL_G, the potentials VPL_R, VPL_B, and VPL_G are also set as VPL_R>VPL_B>VPL_G, and the potential is set differently for each color.

When the capacitance parasitizing in the relay line 14b is different for each color, and the potential VPL is used in common, the voltage characteristics of the second DA conversion circuit unit Lwb are different for each color, and display quality is reduced. In contrast, as in the third exemplary embodiment, when the potential VPL is changed for each color in accordance with the capacitance parasitizing in the relay line 14b, the voltage characteristics of the second DA conversion circuit unit Lwb are made even, so that reduction in display quality can be suppressed.

In the third exemplary embodiment, each of the potentials VPL_R, VPL_B, and VPL_G is set in accordance with the size of the parasitic capacitance, but the potentials VPH_R, VPH_B, and VPH_G may be set. In addition, the capacitance value of the capacitance element Cser may be changed for each color, that is, for each of the circuits Rb, Gb, and Bb. However, since the capacitance value of the capacitance element Cser is uniquely determined by manufacturing, it is difficult to adjust after the manufacturing, and thus a configuration may be adopted in which the potential VPL or the potential VPH can be adjusted afterward.

Note that, R (red) is an example of a first color, B (blue) is an example of a second color, and G (green) is an example of a third color. The potential VPL_R is an example of a third potential of the second DA conversion circuit unit corresponding to the first color, and the potential VPL_B is an example of a third potential of the second DA conversion circuit unit corresponding to the second color, and the potential VPL_G is an example of a third potential of the second DA conversion circuit unit corresponding to the third color.

Of the configuration illustrated in FIG. 16, that is, of a configuration in which the DA conversion circuits 500 of the respective circuits Rb, Bb, and GB are arrayed along the Y direction in a range narrower than the width 3W, a configuration of the capacitance elements C5 to C9 in the first DA conversion circuit unit Upb will be described. Ratios of the capacitance values of the capacitance elements C5 to C9 are "1", "2", "4", "8", and "16" in order. Thus, for example, a configuration is adopted in which, the capacitance element C5 is used as a basic capacitance element, and in the capacitance elements C6 to C9, the two, four, eight, and sixteen base capacitance elements are coupled in parallel, respectively.

Figure 20:
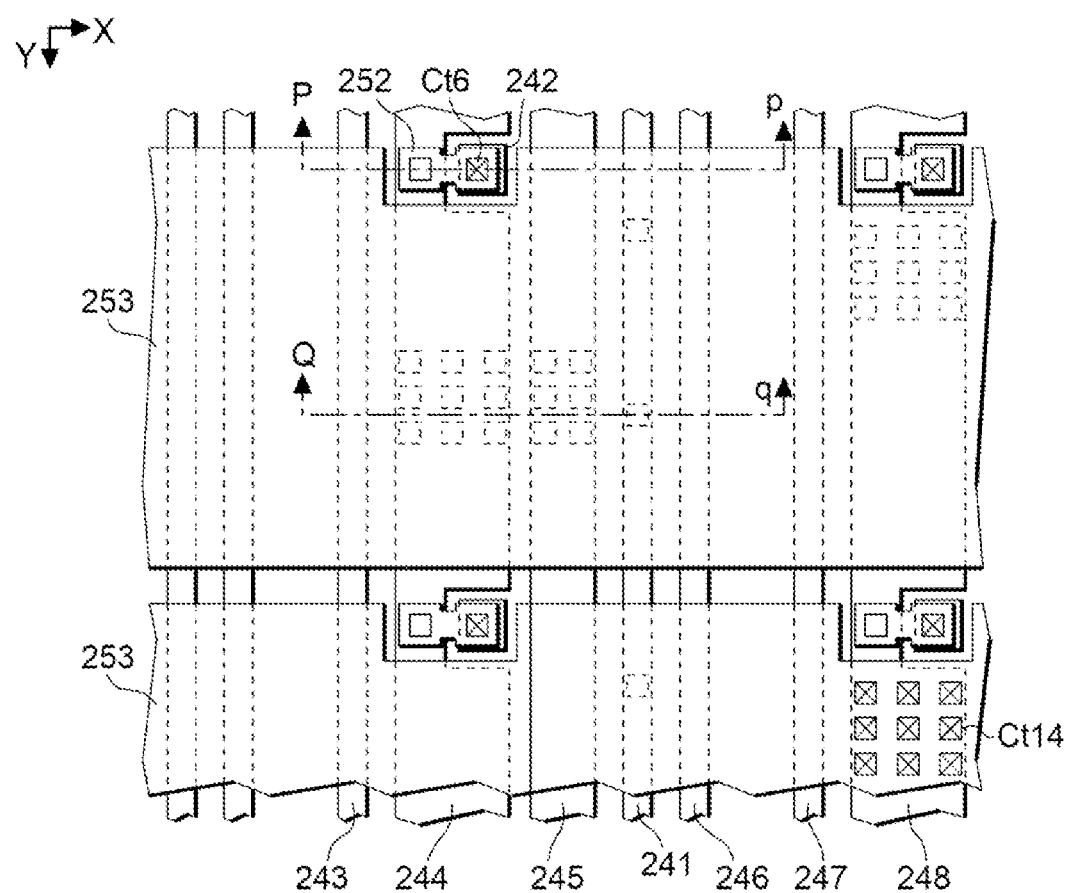
FIG. 20 is a plan view illustrating an example of the capacitance element in the DA conversion circuit.
Figure 21:
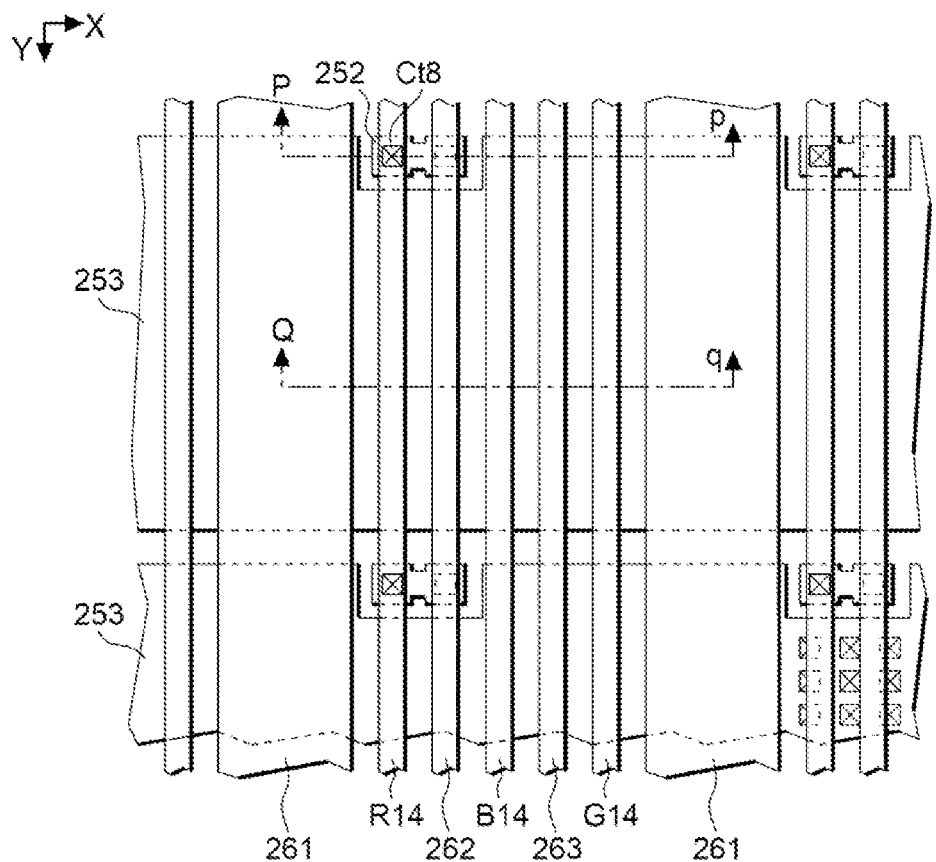
FIG. 21 is a plan view illustrating an example of the capacitance element in the DA conversion circuit.
Figure 22:
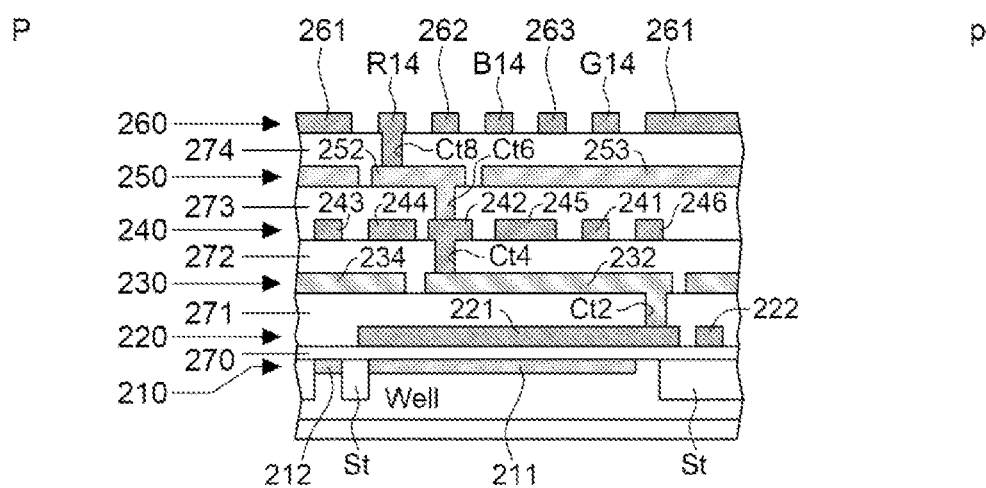
FIG. 22 is a partial cross-sectional view taken along a line P-p in FIG. 17 to FIG. 21.
Figure 23:
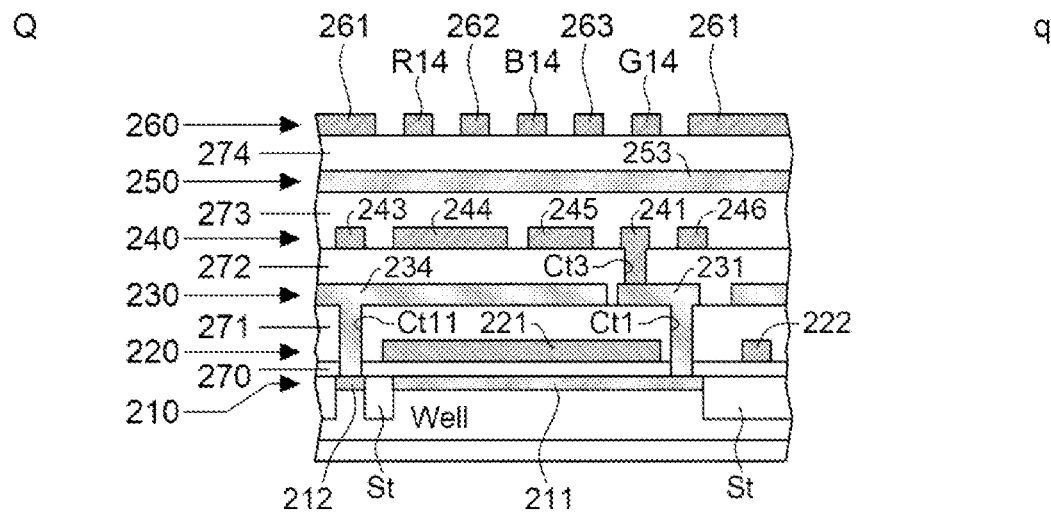
FIG. 23 is a partial cross-sectional view taken along a line Q-q in FIG. 17 to FIG. 21.

FIG. 17 to FIG. 21 are plan views illustrating a configuration of such one basic capacitance element, and a periphery thereof, FIG. 22 is a partial cross-sectional view of the basic capacitance element in FIG. 17 to FIG. 21 taken along the line P-p, and FIG. 23 is a partial cross-sectional view of the basic capacitance element in FIG. 17 to FIG. 21 taken along the line Q-q.

The electro-optical device 10 is formed in a semiconductor substrate as described above, but in the semiconductor substrate, layers used as conductive layers or wiring layers are a total of six layers of a semiconductor layer 210, a gate electrode layer 220, a first wiring layer 230, a second wiring layer 240, a third wiring layer 250, and a fourth wiring line layer 260 in order from a base material. Therefore, when attempting to represent a plan view of the capacitance element C5 and the periphery thereof with one figure, the figure becomes complicated, and thus, for the above six layers, adjacent two layers are illustrated in plan view in FIG. 17 to FIG. 21.

Figure 17:
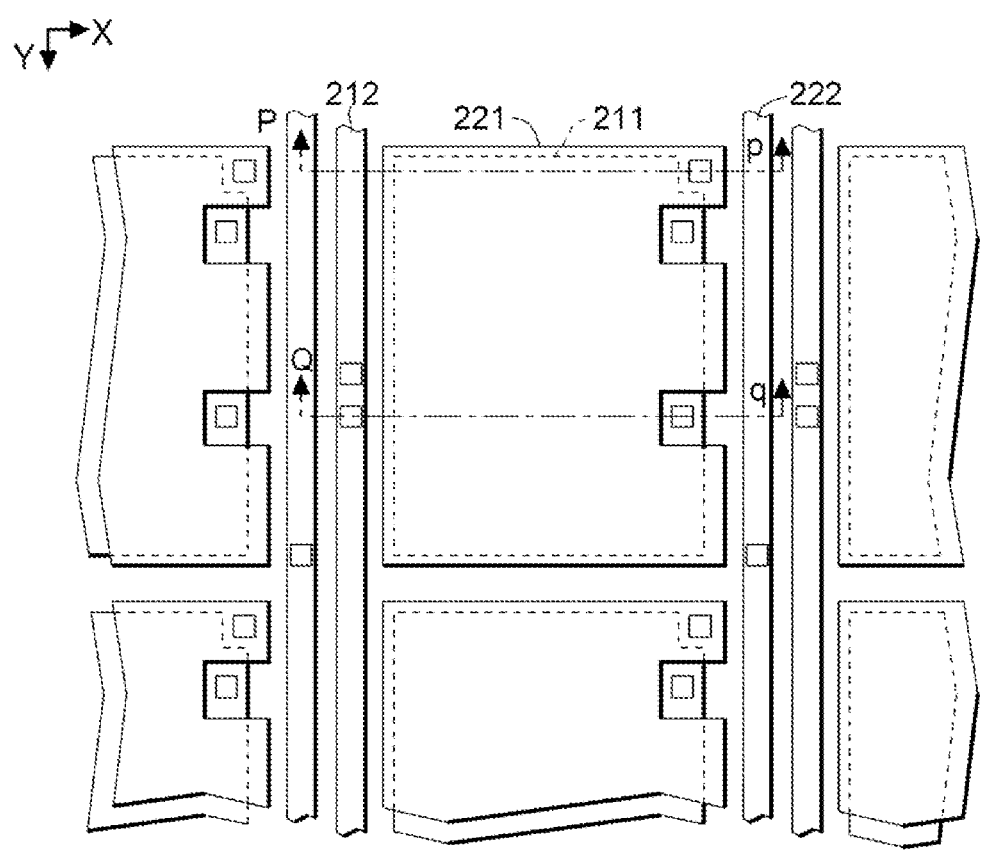
FIG. 17 is a plan view illustrating an example of a capacitance element in the DA conversion circuit.
Figure 18:
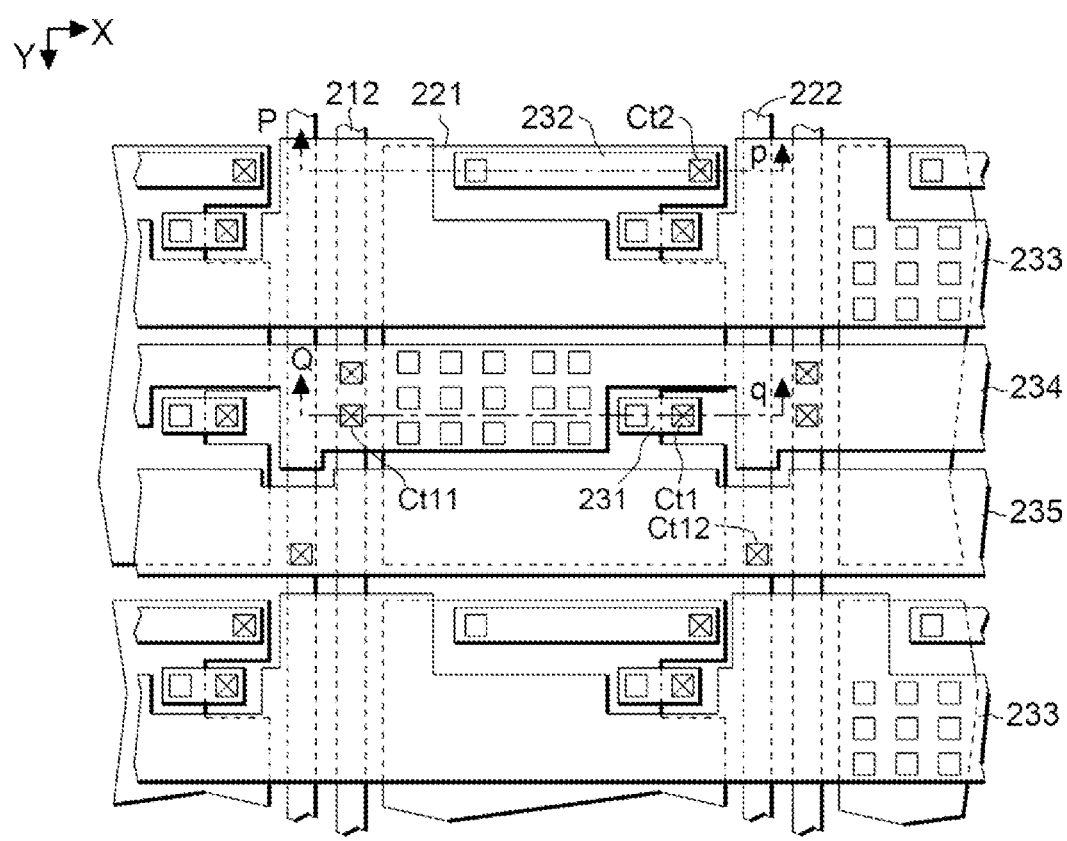
FIG. 18 is a plan view illustrating an example of the capacitance element in the DA conversion circuit.
Figure 19:
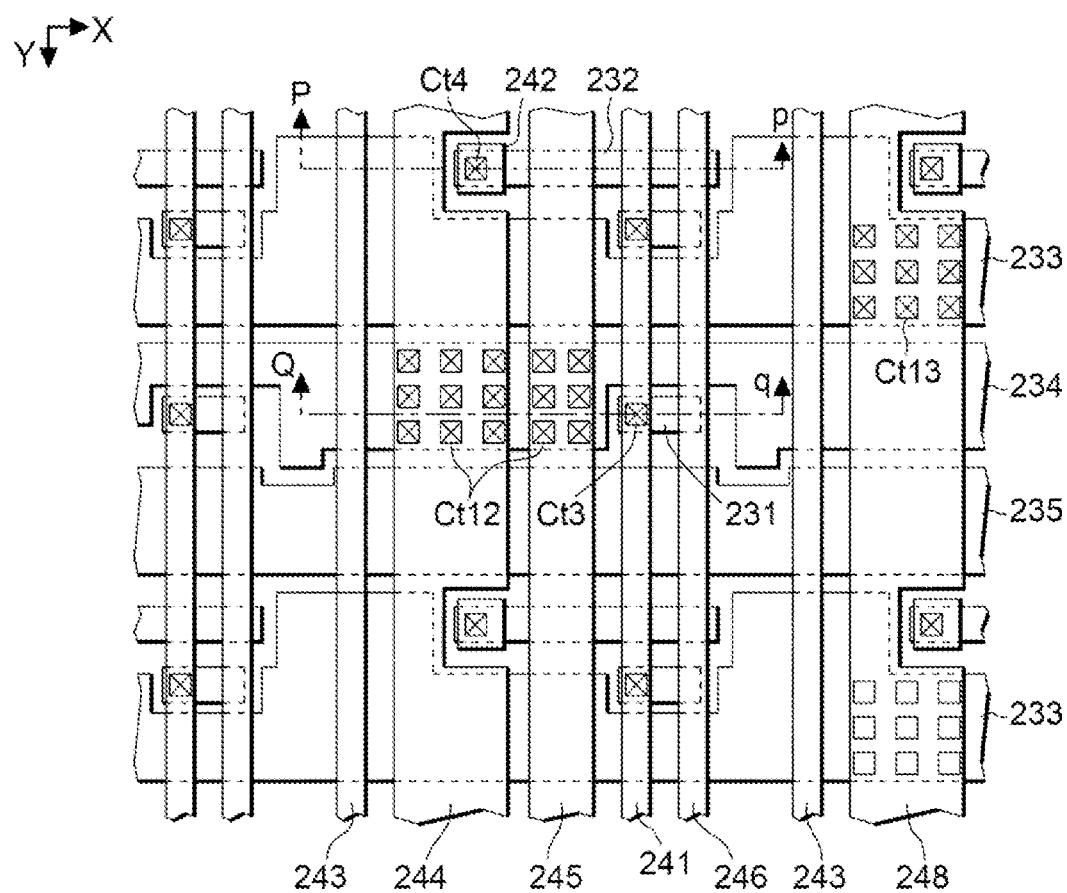
FIG. 19 is a plan view illustrating an example of the capacitance element in the DA conversion circuit.

Specifically, FIG. 17 illustrates a wiring pattern including the semiconductor layer 210 and the gate electrode layer 220. FIG. 18 illustrates a wiring pattern including the gate electrode layer 220 and the first wiring layer 230. FIG. 19 illustrates a wiring pattern including the first wiring layer 230 and the second wiring layer 240. FIG. 20 illustrates a wiring pattern including the second wiring layer 240 and the third wiring layer 250. FIG. 21 illustrates a wiring pattern including the third wiring layer 25 and the fourth wiring layer 260.

As illustrated in FIG. 17, FIG. 22, and FIG. 23, the basic capacitance element is a configuration in which the gate insulating layer 270 is sandwiched between an electrode 211 formed from the semiconductor layer 210, and an electrode 221 obtained by patterning the gate electrode layer 220.

Note that, the electrode 211 is formed by injection of impurity ions in a p-well region Well, for example. A region St is a trench for separating regions of respective elements adjacent to each other.

Further, in addition to the electrode 211, a wiring line 212 is formed in the semiconductor layer 210 along the Y direction. The wiring line 212 is used as a power source wiring line to which the potential VL is supplied, for example.

In addition to the electrode 221, a wiring line 222 is formed along the Y direction by patterning of the gate electrode layer 220. The wiring line 222 is used as a power source wiring line to which the potential Vddh of the level shifter Ls is supplied, for example.

As illustrated in FIG. 17, FIG. 18, and FIG. 23, the electrode 211 is coupled to a wiring line 231 via a contact hole Ct1 that opens the gate insulating layer 270 and a first interlayer insulating layer 271. The wiring line 212 is coupled to a wiring line 234 via a contact hole Ct11 that opens the gate insulating layer 270 and the first interlayer insulating layer 271.

As illustrated in FIG. 17, FIG. 18, and FIG. 22, the electrode 221 is coupled to a wiring line 232 via a contact hole Ct2 that opens the first interlayer insulating layer 271. The first interlayer insulating layer 271 is an insulating layer provided between the gate electrode layer 220 and the first wiring layer 230. The wiring lines 231, 232, and 234 are wiring lines formed by patterning of the first wiring layer 230, of these, the wiring lines 231 and 232 are relay wiring lines, and the wiring line 234 is a power source wiring line formed along the X direction.

In addition to the wiring lines 231, 232, and 234, the wiring lines 233 and 235 are formed along the X direction by patterning of the first wiring layer 230.

When the basic capacitance element illustrated configures the capacitance element C6, the wiring line 233 is used as a power source wiring line for supplying, for example, the potential VPH. Note that, when the basic capacitance element illustrated configures any of the lower capacitance elements C0 to C4, the wiring line 233 is used as a power source wiring line for supplying the potential VPL. The wiring line 235 is coupled to the wiring line 222 that supplies the potential Vddh via a contact hole Ct12.

As illustrated in FIG. 18, FIG. 19, and FIG. 23, the wiring line 231 is coupled to a wiring line 241, via a contact hole Ct3 that opens a second interlayer insulating layer 272. As illustrated in FIG. 18, FIG. 19, and FIG. 22, the wiring line 232 is coupled to a wiring line 242 via a contact hole Ct4 that opens the second interlayer insulating layer 272. The second interlayer insulating layer 272 is an insulating layer provided between the first wiring layer 230 and the second wiring layer 240.

The wiring line 241 is formed by patterning of the second wiring layer 240, and is coupled to any of the selection circuits 515 to 519. For example, when the basic capacitance element illustrated configures the capacitance element C6, the electrode 211, which is one end of the basic capacitance element, is coupled to the selection circuit 516 via the wiring lines 231 and 241 in order. The wiring line 242 is a relay wiring line formed by patterning of the second wiring layer 240.

In addition to the wiring lines 241 and 242, wiring lines 243, 244, 245, 246, and 248 are formed along the Y direction by patterning of the second wiring layer 240. Of these, for example, the wiring lines 243 and 246 are used to supply control signals, and the wiring lines 244 and 245 are coupled via the contact hole Ct12 to the wiring line 212 that supplies the potential VL, and are used as power source wiring lines. The wiring line 248 is coupled to the wiring line 233 that supplies the potential VPH via a contact hole Ct13, and is used as a power source wiring line.

As illustrated in FIG. 19, FIG. 20, and FIG. 22, the wiring line 242 is coupled to a wiring line 252 via a contact hole Ct6 that opens a third interlayer insulating layer 273. The third interlayer insulating layer 273 is an insulating layer provided between the second wiring layer 240 and the third wiring layer 250. The wiring line 252 is a relay wiring line formed by patterning of the third wiring layer 250.

In addition to the wiring line 252, a wiring line 253 is formed along the X direction by patterning of the third wiring layer 250. The wiring line 253 is coupled to the wiring line 248 that powers with the potential VPH via a contact hole Ct14, and is used as a power source wiring line.

As illustrated in FIG. 20, FIG. 21, and FIG. 22, the wiring line 252 is coupled to the data line R14 via a contact hole Ct8 that opens a fourth interlayer insulating layer 274. The fourth interlayer insulating layer 274 is an insulating layer provided between the third wiring layer 250 and the fourth wiring layer 260. The data line R14 is formed by patterning of the fourth wiring layer 260.

In addition to the data line R14, the data lines B14, G14, wiring lines 261, 262, and 263 are formed by patterning of the fourth wiring layer 260.

The data line R14 is commonly coupled to the other ends of the respective capacitor elements C5 to C9 of the first DA conversion circuit unit Upb in the circuit Rb, and to the other end of the capacitance element Cser.

The data line B14 is commonly coupled to the other ends of the respective capacitor elements C5 to C9 of the first DA conversion circuit unit Upb in the circuit Bb located lower than the circuit Rb in FIG. 16, and to the other end of the capacitance element Cser. The data line G14 is commonly coupled to the other ends of the respective capacitor elements C5 to C9 of the first DA conversion circuit unit Upb in the circuit Gb located lower than the circuit Bb in FIG. 16, and to the other end of the capacitance element Cser.

Further, the wiring lines 261, 262, and 263 are used as power source wiring lines that supply, for example, the potential Vel.

Here, the description has been given using the basic capacitance element configuring the capacitance elements C5 to C9 of the first DA conversion circuit unit Upb in the circuit Rb as an example, the basic capacitance element configuring the capacitance elements C0 to C4 of the second DA conversion circuit unit Lwb in the circuit Rb have a similar configuration. However, note that, the data line R14 is replaced by the relay line R14b, and the wiring line that supplies the potential VPH is replaced by the wiring line that supplies the potential VPL.

The circuits Bb and Gb each have a similar configuration to that of the circuit Rb.

However, based on the configuration illustrated in FIG. 21, in the circuit Bb, in the first DA conversion circuit unit Upb, the data line R14 is replaced by the relay line R14b, and in the second DA conversion circuit unit Lwb, the data line R14 is replaced by the relay line R14b, and the data line B14 is replaced by the relay line B14b.

Similarly, based on the configuration illustrated in FIG. 21, in the circuit Gb, in the first DA conversion circuit unit Upb, the data line R14 is replaced by the relay line R14b, and the data line B14 is replaced by the relay line B14b, and in the second DA conversion circuit unit Lwb, the data line R14 is replaced by the relay line R14b, the data line B14 is replaced by the relay line B14b, and the data line G14 is replaced by the relay line G14b.

In this way, the data line R14 is shielded by the wiring lines 261 and 262 adjacent to each other on the left and right sides in the figure. Similarly, the data line G14 is shielded by the wiring lines 262 and 263 adjacent to each other on the left and right sides, and the data line B14 is shielded by the wiring lines 263 and 261 adjacent to each other on the left and right sides.

Additionally, the relay line R14b is shielded by the wiring lines 261 and 262 adjacent to each other on the left and right sides in the figure, and similarly, the relay wire G14b is shielded by the wiring lines 262 and 263 adjacent to each other on the left and right sides, and the relay line B14b is shielded by the wiring lines 263 and 261 adjacent to each other on the left and right sides.

Also, power source wiring lines of fixed potentials are formed in the first wiring layer 230 and the third wiring layer 250 along the X direction, and are formed in the second wiring layer 240 and the fourth wiring line layer 260 along the Y direction, and are formed alternately in the X direction and the Y direction, in a mesh shape when viewed in plan view.

In this manner, each of the data lines R14, G14, B14, the relay lines R14b, G14b, and B14b is shielded by the power supply wiring lines adjacent to each other on the left and right sides. Also, the basic capacitance element is shielded by mesh-shaped power supply wiring lines in plan view. Thus, potential variations due to noise is suppressed.

Application Example/Modified Example

The various exemplary embodiments described above (hereinafter also referred to as the "exemplary embodiments and the like"), various variations or applications are possible as follows).

The DA conversion circuit 500 according to the various exemplary embodiments described above has the configuration in which, the ten bits are divided into the higher bits D5 to D9 and the lower bits D0 to D4, and of these, the bits D5 to D9 are converted by the first DA conversion circuit Upb and are directly output to the data line 14, and the bits D0 to D4 are converted by the second DA conversion circuit Lwb and are output to the data line 14 via the capacitance element Cser, but it is sufficient that the number of bits of data to be converted is equal to or greater than 2.

Further, in the electro-optical device 10 to which the DA conversion circuit 500 according to the exemplary embodiment and the like are applied, the OLED 130 has been illustrated and described as an example of the display element, but other display elements may be used. For example, an LED may be used as the display element, or a liquid crystal element may be used. That is, as the display element, it is sufficient that an electro-optical element is used that is brought into an optical state in accordance with a voltage of a data signal output from the DA conversion circuit 500.

In the exemplary embodiments and the like, the configuration has been adopted in which the threshold voltage of the transistor 121 in the pixel circuit 110 is compensated for, but a configuration in which the threshold voltage is not compensated for, specifically, a configuration in which the transistor 123 is omitted may be adopted.

The channel type of each of the transistors 66, 121 to 125 is not limited to the exemplary embodiments and the like. Further, these transistors 66, 121 to 125 may also be replaced by transmission gates as appropriate. Conversely, the transmission gates Tg0 to Tg2 may be replaced with one channel type of transistors.

Electronic Apparatus

Next, an electronic apparatus to which the electro-optical device 10 according to the above-described exemplary embodiments is applied will be described. The electro-optical device 10 is suitable for application with a small pixel and high definition display. In this regard, a head-mounted display will be described as an example of the electronic apparatus.

Figure 24:
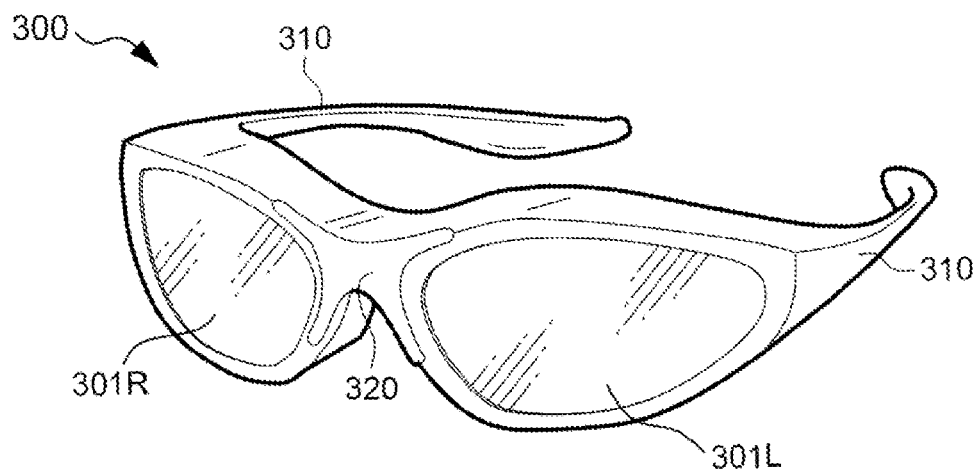
FIG. 24 is a perspective view illustrating a head-mounted display using an electro-optical device.
Figure 25:
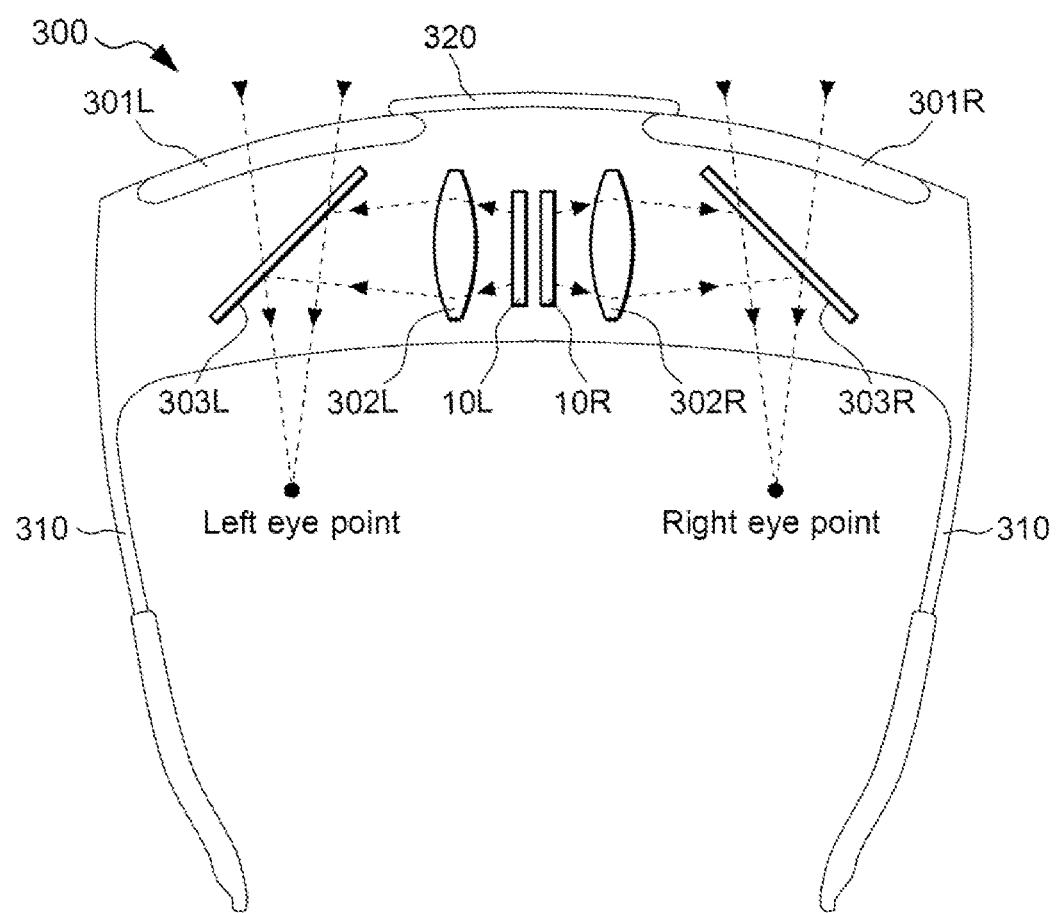
FIG. 25 is a diagram illustrating an optical configuration of the head-mounted display.

FIG. 24 is a diagram illustrating appearance of a head-mounted display, and FIG. 25 is a diagram illustrating an optical configuration of the head-mounted display.

First, as illustrated in FIG. 24, a head-mounted display 300 includes, in terms of appearance, temples 310, a bridge 320, and lenses 301L and 301R, as with typical eye glasses. In addition, as illustrated in FIG. 25, the head-mounted display 300 is provided with an electro-optical device 10L for a left eye and an electro-optical device 10R for a right eye in a vicinity of the bridge 320 and on a back side (a lower side in the figure) of the lenses 301L and 301R.

An image display surface of the electro-optical device 10L is arranged to be on the left side in FIG. 25. According to this configuration, a display image by the electro-optical device 10L is output via an optical lens 302L in a 9-o'clock direction in the figure. A half mirror 303L reflects the display image by the electro-optical device 10L in a 6-o'clock direction, while the half mirror 303L transmits light entering in a 12-o'clock direction. An image display surface of the electro-optical device 10R is arranged on the right side opposite to the electro-optical device 10L. According to this configuration, a display image by the electro-optical device 10R is output via an optical lens 302R in a 3-o'clock direction in the figure. A half mirror 303R reflects the display image by the electro-optical device 10R in the 6-o'clock direction, while the half mirror 303R transmits light entering in the 12-o'clock direction.

In this configuration, a wearer of the head-mounted display 300 can observe the display images by the electro-optical devices 10L and 10R in a see-through state in which the display images by the electro-optical devices 10L and 10R overlap with an outside.

In addition, in the head-mounted display 300, of images for both the eyes with parallax, an image for the left eye is displayed by the electro-optical device 10L, and an image for the right eye is displayed by the electro-optical device 10R, and thus, it is possible to cause the wearer to sense the displayed images as an image displayed having a depth or a three dimensional effect.

Note that, in addition to the head-mounted display 300, an electronic apparatus including the electro-optical device 10 can be applied to an electronic viewing finder in a video camera, a lens-exchangeable digital camera, or the like, a personal digital assistant, a display unit of a wrist watch, a light valve in a projection type projector, and the like.

Supplementary Note

A DA conversion circuit according to an aspect (Aspect 1) includes a first DA conversion circuit unit corresponding to a higher bit among a plurality of bits, a second DA conversion circuit unit corresponding to a lower bit among the plurality of bits, a coupling capacitance provided between the first DA conversion circuit unit and the second DA conversion circuit unit, wherein the first DA conversion circuit unit includes a higher capacitance element unit and a higher switching element unit, the second DA conversion circuit unit includes a lower capacitance element unit and a lower switching element unit, the higher switching element unit supplies either a first potential or a second potential to one end of the higher capacitance element unit, the lower switching element unit supplies either the first potential or a third potential to one end of the lower capacitance element unit, and the third potential is different from the second potential.

In Aspect 1, an output voltage of the second DA conversion circuit unit is compressed by the coupling capacitance and output together with an output voltage of the first DA conversion circuit unit. When the second potential and the third potential are identical, and output characteristics of the first DA conversion circuit unit and output characteristics of the second DA conversion circuit unit are uneven, linearity in characteristics of output voltage when data represented by a plurality of bits is converted is impaired, but as in Aspect 1, the linearity in the characteristics of output voltage can be improved by making the second potential and the third potential different.

In a DA conversion circuit according to a specific aspect of Aspect 1 (Aspect 2), the first DA conversion circuit unit includes a capacitance element having a capacitance value corresponding to a weight of the higher bit, the second DA conversion circuit unit includes a capacitance element having a capacitance value corresponding to a weight of the lower bit, and the coupling capacitance is provided between another end of the capacitance element corresponding to the higher bit and another end of the capacitance element corresponding to the lower bit.

In a DA conversion circuit according to a specific aspect of the Aspect 2 (Aspect 3), a capacitance value of the coupling capacitance is substantially the same as a capacitance value of a capacitance element corresponding to a bit having a smallest weight among the higher bits, and the third potential is higher than the second potential.

According to Aspect 3, it is possible to improve linearity in characteristics of output voltage when data represented by a plurality of bits is converted.

In a DA conversion circuit according to another specific aspect of Aspect 2 (Aspect 4), a capacitance value of the coupling capacitance is greater than a capacitance value of a capacitance element corresponding to a bit having a smallest weight among the higher bits, and the third potential is lower than the second potential.

According Aspect 4, it is possible to suppress occurrence of a reverse phenomenon in which a voltage when data having a small decimal value represented by the plurality bits is converted is higher than a voltage when data having a large decimal value is converted.

ADA conversion circuit according to another aspect (Aspect 5) includes a set at least corresponding to a first color, a second color, and a third color, the set including a first DA conversion circuit unit corresponding to a higher bit among a plurality of bits, a second DA conversion circuit unit corresponding to a lower bit among the plurality of bits, and a coupling capacitance provided between the first DA conversion circuit unit and the second DA conversion circuit unit, wherein the first DA conversion circuit unit corresponding to the first color, the second color, and the third color includes a higher capacitance element unit and a higher switching element unit, the second DA conversion circuit unit corresponding to the first color, the second color, and the third color includes a lower capacitance element unit and a lower switching element unit, the higher switching element unit supplies either a first potential or a second potential to one end of the higher capacitance element unit, the lower switching element unit supplies either the first potential or a third potential to one end of the lower capacitance element unit, in the first DA conversion circuit unit and the second DA conversion circuit unit corresponding to the same color, the second potential is different from the third potential, and a third potential of the second DA conversion circuit unit corresponding to the first color, a third potential of the second DA conversion circuit unit corresponding to the second color, and a third potential of the second DA conversion circuit unit corresponding to the third color are different.

According to Aspect 5, output characteristics of the first DA conversion circuit unit and characteristics of output voltage from the second DA conversion circuit unit can be made even, for each color. Note that, examples of the colors include, for example, three colors of R (red), G (green), and B (blue), but four or more colors may be used.

In an electro-optical device according to Aspect 6, a plurality of bits are converted into a data signal by the DA conversion circuit of any one of Aspect 1 to Aspect 5, and an electro-optical element that is brought into an optical state based on the data signal is included. According to Aspect 7, it is possible to save space in the electro-optical device.

Also, an electronic apparatus according to Aspect 7 includes the electro-optical device according to aspect 6.

What is claimed is:

1. An electro-optical device, comprising:
   a first DA conversion circuit unit corresponding to a higher bit among a plurality of bits;
   a second DA conversion circuit unit corresponding to a lower bit among the plurality of bits;
   a coupling capacitance provided between the first DA conversion circuit unit and the second DA conversion circuit unit,
   a data line; and
   an electro-optical element, wherein
   the first DA conversion circuit unit includes a higher capacitance element unit and a higher switching element unit,
   the second DA conversion circuit unit includes
   a lower capacitance element unit and a lower switching element unit,
   the higher switching element unit supplies either a first potential or a second potential to one end of the higher capacitance element unit,
   the lower switching element unit supplies either the first potential or a third potential to one end of the lower capacitance element unit,
   the third potential is different from the second potential, and
   the first DA conversion circuit unit is electrically connected to the electro-optical element via the data line.

2. An electronic apparatus comprising the electro-optical device according to claim 1.

3. The electro-optical device according to claim 1, wherein
   the first DA conversion circuit unit includes
   a capacitance element having a capacitance value corresponding to a weight of the higher bit,
   the second DA conversion circuit unit includes
   a capacitance element having a capacitance value corresponding to a weight of the lower bit, and
   the coupling capacitance is
   provided between another end of the capacitance element corresponding to the higher bit and another end of the capacitance element corresponding to the lower bit.

4. The electro-optical device according to claim 3, wherein
   a capacitance value of the coupling capacitance is
   substantially the same as a capacitance value of a capacitance element corresponding to a bit having a smallest weight among the higher bits, and
   the third potential is higher than the second potential.

5. The electro-optical device according to claim 3, wherein
   the capacitance value of the coupling capacitance is
   greater than a capacitance value of a capacitance element corresponding to a bit having a smallest weight among the higher bits, and
   the third potential is lower than the second potential.

6. An electronic apparatus comprising the electro-optical device according to claim 3.

7. An electro-optical device, comprising
a set including, at least corresponding to a first color, a second color, and a third color,
a first DA conversion circuit unit corresponding to a higher bit among a plurality of bits,
a second DA conversion circuit unit corresponding to a lower bit among the plurality of bits;
a coupling capacitance provided between the first DA conversion circuit unit and the second DA conversion circuit unit,
a data line; and
an electro-optical element, wherein
the first DA conversion circuit unit corresponding to the first color, the second color, and the third color includes
a higher capacitance element unit and a higher switching element unit,
the second DA conversion circuit unit corresponding to the first color, the second color, and the third color includes
a lower capacitance element unit and a lower switching element unit,
the higher switching element unit supplies either a first potential or a second potential to one end of the higher capacitance element unit,
the lower switching element unit supplies either the first potential or a third potential to one end of the lower capacitance element unit,
in the first DA conversion circuit unit and the second DA conversion circuit unit corresponding to the same color,
the second potential is different from the third potential,
a third potential of the second DA conversion circuit unit corresponding to the first color, a third potential of the second DA conversion circuit unit corresponding to the second color, and a third potential of the second DA conversion circuit unit corresponding to the third color are different, and
the first DA conversion circuit unit is electrically connected to the electro-optical element via the data line.

8. An electronic apparatus comprising the electro-optical device according to claim 7.

* * * * *